(12) United States Patent
Liu

(10) Patent No.: US 11,955,474 B2
(45) Date of Patent: *Apr. 9, 2024

(54) SEMICONDUCTOR LAYOUT FOR ELECTROSTATIC DISCHARGE PROTECTION, ELECTROSTATIC DISCHARGE PROTECTION CIRCUIT, AND METHOD FOR FORMING THE SAME

(71) Applicant: NANYA TECHNOLOGY CORPORATION, New Taipei (TW)

(72) Inventor: Fang-Wen Liu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 96 days.

This patent is subject to a terminal disclaimer.

(21) Appl. No.: 17/892,797

(22) Filed: Aug. 22, 2022

(65) Prior Publication Data

US 2024/0063214 A1 Feb. 22, 2024

(51) Int. Cl.
*H01L 27/02* (2006.01)
*H02H 9/04* (2006.01)

(52) U.S. Cl.
CPC ...... *H01L 27/0288* (2013.01); *H01L 27/0266* (2013.01); *H01L 27/0292* (2013.01); *H01L 27/0296* (2013.01); *H02H 9/045* (2013.01)

(58) Field of Classification Search
CPC . H02H 9/045; H01L 27/0288; H01L 27/0266; H01L 27/0292; H01L 27/0296
USPC .......................................................... 361/56
See application file for complete search history.

(56) References Cited

U.S. PATENT DOCUMENTS

| | | | |
|---|---|---|---|
| 6,344,385 B1* | 2/2002 | Jun | H01L 27/0266 438/237 |
| 7,825,473 B2* | 11/2010 | Ker | H01L 23/62 257/E29.225 |
| 10,332,871 B2* | 6/2019 | Russ | H01L 28/00 |
| 2006/0092592 A1* | 5/2006 | Huang | H05K 9/0067 361/220 |
| 2007/0019345 A1* | 1/2007 | Loh | H01L 27/0266 361/56 |
| 2019/0206857 A1* | 7/2019 | Lin | H01L 23/585 |
| 2023/0411310 A1* | 12/2023 | Sic | H01L 27/0296 |

OTHER PUBLICATIONS

A design model of gate-coupling NMOS ESD protection circuit (GCNMOS), Wang yuan, .lin Song, Chen Zhongjian, Zhang Ganggang,. 1i Lijiu Institute of Microelectronics, Peking University, 2004, IEEE, p. 856-859 Beijing 100871, China.
Capacitor-Less Design of Power-Rail ESD Clamp Circuit With Adjustable Holding Voltage for On-Chip ESD Protection, IEEE Jouranl of Solid State Circuits, Chih-Ting Yeh and Ming-Dou Ker, Fellow, 2010, pp. 2476-2486.

* cited by examiner

*Primary Examiner* — Kevin J Comber
(74) *Attorney, Agent, or Firm* — Muncy, Geissler, Olds & Lowe, P.C.

(57) ABSTRACT

An electrostatic discharge (ESD) protection circuit is provided. The protection circuit includes a MOS transistor and a resistor. The MOS transistor is electrically coupled to a core circuit. The resistor is electrically coupling to a gate of the MOS transistor for creating a bias on the gate to directing an ESD current to a ground when an ESD event occurs on the core circuit. A layout of the MOS transistor is spaced apart from a layout of the core circuit by a layout of a dummy structure. The resistor is formed by utilizing a portion of the dummy structure.

20 Claims, 19 Drawing Sheets

SEMICONDUCTOR LAYOUT FOR ELECTROSTATIC DISCHARGE PROTECTION, ELECTROSTATIC DISCHARGE PROTECTION CIRCUIT, AND METHOD FOR FORMING THE SAME

TECHNICAL FIELD

The present disclosure relates to a semiconductor layout and a circuit, and more particularly to a semiconductor layout and a circuit for electrostatic discharge (ESD) protection.

DISCUSSION OF THE BACKGROUND

Integrated circuits (ICs) are widely used for a variety of application. However, one of the reliability issues is the possible vulnerability to ESD events. For example, an ESD event may occur when a charged object, such as a human body with a static buildup or a piece of equipment that has a potential different from that of an IC, discharges into the IC.

The discharge consists, typically, of current levels exceeding one ampere within a duration, such as 200 nanoseconds. The magnitude of the peak current and the wave shape of the discharge depend on the effective charge resistance, capacitance, and inductance of the objects experiencing the ESD event. The result of ESD on unprotected ICs is often destruction, characterized by melting or explosion of a part of the IC. It is a common practice for an IC designer to include extra components in an IC to provide ESD paths that bypass the components used for normal circuit functions. These normal circuit components are, therefore, protected from the ESD event.

Therefore, desirable in the art of ESD protection designs are improved ESD protection circuits that provide enhanced ESD protection, without a large occupied area and a complicated rearrangement of circuit layouts.

SUMMARY

One aspect of the present disclosure provides a semiconductor layout used for electrostatic discharge (ESD) protection. The semiconductor layout includes a core circuit, a MOS transistor, and dummy structure and a resistor. The MOS transistor is configured to protect the core circuit by dispersing an ESD current thereacross during an ESD event. The dummy structure is arranged between the MOS transistor and the core circuit. The dummy structure comprises at least one of a poly layer and a metal layer. The resistor overlaps the dummy structure and is adjacent to the MOS transistor. The resistor includes a portion of the at least one of the poly layer and the metal layer.

Another aspect of the present disclosure provides an electrostatic discharge (ESD) protection circuit. The protection circuit includes a MOS transistor and a resistor. The MOS transistor is electrically coupled to a core circuit. The resistor is electrically coupling to a gate of the MOS transistor for creating a bias on the gate to directing an ESD current to a ground when an ESD event occurs on the core circuit. A layout of the MOS transistor is spaced apart from a layout of the core circuit by a layout of a dummy structure. The resistor is formed by utilizing a portion of the dummy structure.

Another aspect of the present disclosure provides method of generating a semiconductor layout used for an electrostatic discharge (ESD) protection circuit. The method includes forming a core circuit; forming a MOS transistor, spaced apart from the core circuit; forming a dummy structure, arranged between the MOS transistor and the core circuit, wherein the dummy structure comprises at least one of a poly layer and a metal layer; utilizing a portion of the at least one of the poly layer and the metal layer to form a resistor; overlapping the resistor with at least a portion of the dummy structure, wherein a distance between the resistor and the MOS transistor is smaller than that of between the resistor and the core circuit.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
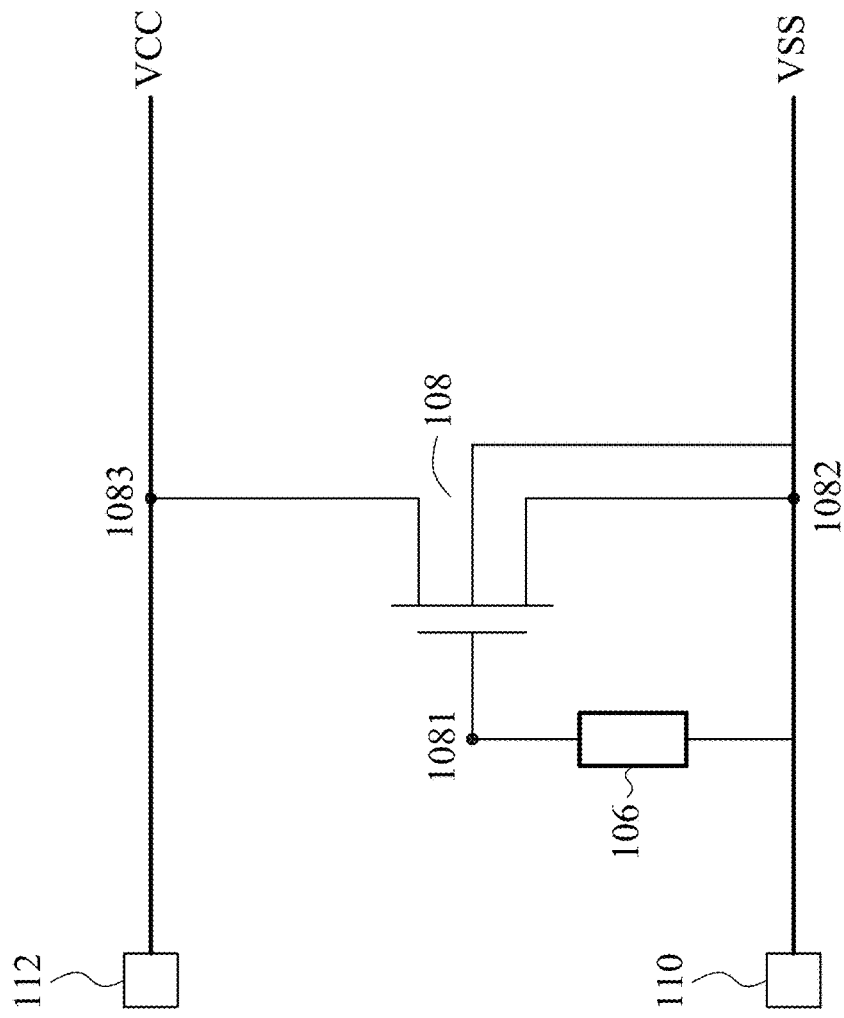
FIG. 1A is a schematic diagram of an electrostatic discharge (ESD) protection circuit, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a schematic diagram of an electrostatic discharge (ESD) protection circuit 10, in accordance with some embodiments of the present disclosure.

Referring to FIG. 1A, the ESD protection circuit 10 may include a resistor 106 and a MOS transistor 108. The ESD protection circuit 10 can be used to protect a core circuit from being damaged during an ESD event. The resistor 106 can be electrically connected between the gate 1081 of the MOS transistor 108 and the pad 110. The resistor 106 can also be electrically connected between the gate 1081 of the MOS transistor 108 and the voltage source VSS. It can be understood by those skilled in the art that the voltage source VSS refers to the operation voltage of the ESD protection circuit 10.

In some embodiments, the drain 1083 of the MOS transistor 108 can be electrically connected to the pad 112. The drain 1083 of the MOS transistor 108 can be electrically connected to the voltage source VCC. It can be understood by those skilled in the art that the voltage source VCC refers to the operation voltage of the ESD protection circuit 10.

In some embodiments, the source 1082 of the MOS transistor 108 can be electrically connected to the pad 110. The source 1082 of the MOS transistor 108 can be electrically connected to the resistor 106. The source 1082 of the MOS transistor 108 can further be electrically connected to the voltage source VSS.

Figure 1B:
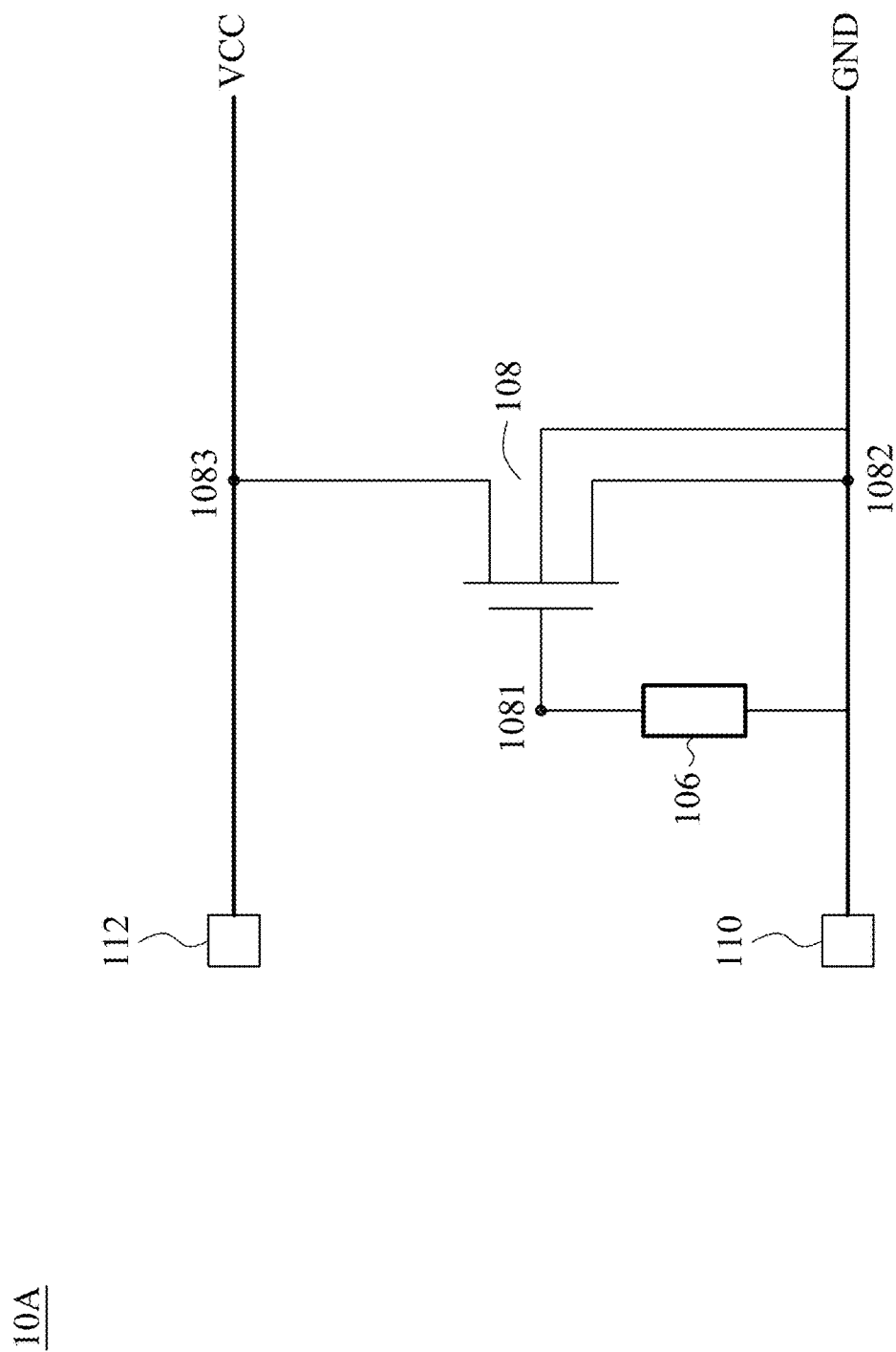
FIG. 1B is another schematic diagram of an ESD protection circuit, in accordance with some embodiments of the present disclosure.

FIG. 1B is another schematic diagram of an ESD protection circuit 10A, in accordance with some embodiments of the present disclosure. The ESD protection circuit 10A of FIG. 1B is similar to the ESD protection circuit 10 of FIG. 1A, except for the differences described as follows.

In some embodiments, the source 1082 of the MOS transistor 108 can be electrically connected to the ground GND. The resistor 106 can be electrically connected between the ground GND and the gate 1081 of the MOS transistor 108. The pad 110 may be electrically connected to the ground GND.

In some embodiments, the MOS transistor 108 can include a NMOS transistor. In a normal operation, the MOS transistor 108 is always turned off because its gate 1081 is electrically coupled to the ground GND. The voltage signals input through the pad 112 will travel directly to the core circuit, without being diverted to the pad 110 or the ground GND through the MOS transistor 108. In other words, the MOS transistor 108 can be deemed as invisible to the core circuit in the normal operation.

During the ESD event, the pad 112 may receive an ESD current, which immediately increase the voltage level at the drain 1083 of the MOS transistor 108. Eventually, this causes an avalanche breakdown, the MOS transistor 108 can conduct through a substrate current path. A great amount of ESD current will be, therefore, diverted to the resistor 106, which is in connection with the pad 110, through the MOS transistor 108.

Due to the resistance provided by the resistor 106, a part of the current passing through it will generate a bias applied to the gate 1081 of the MOS transistor 108. This helps to turn on the MOS transistor 108, and creates a surface current path under its gate 1081, in addition to the substrate current path, for passing the ESD current. As a result, the trigger voltage of the MOS transistor 108 can be lowered. This may allow the MOS transistor 108 to respond to the ESD current more quickly. Therefore, the performance of the ESD protection circuits 10 and 10A as a whole, is improved.

Figure 1C:
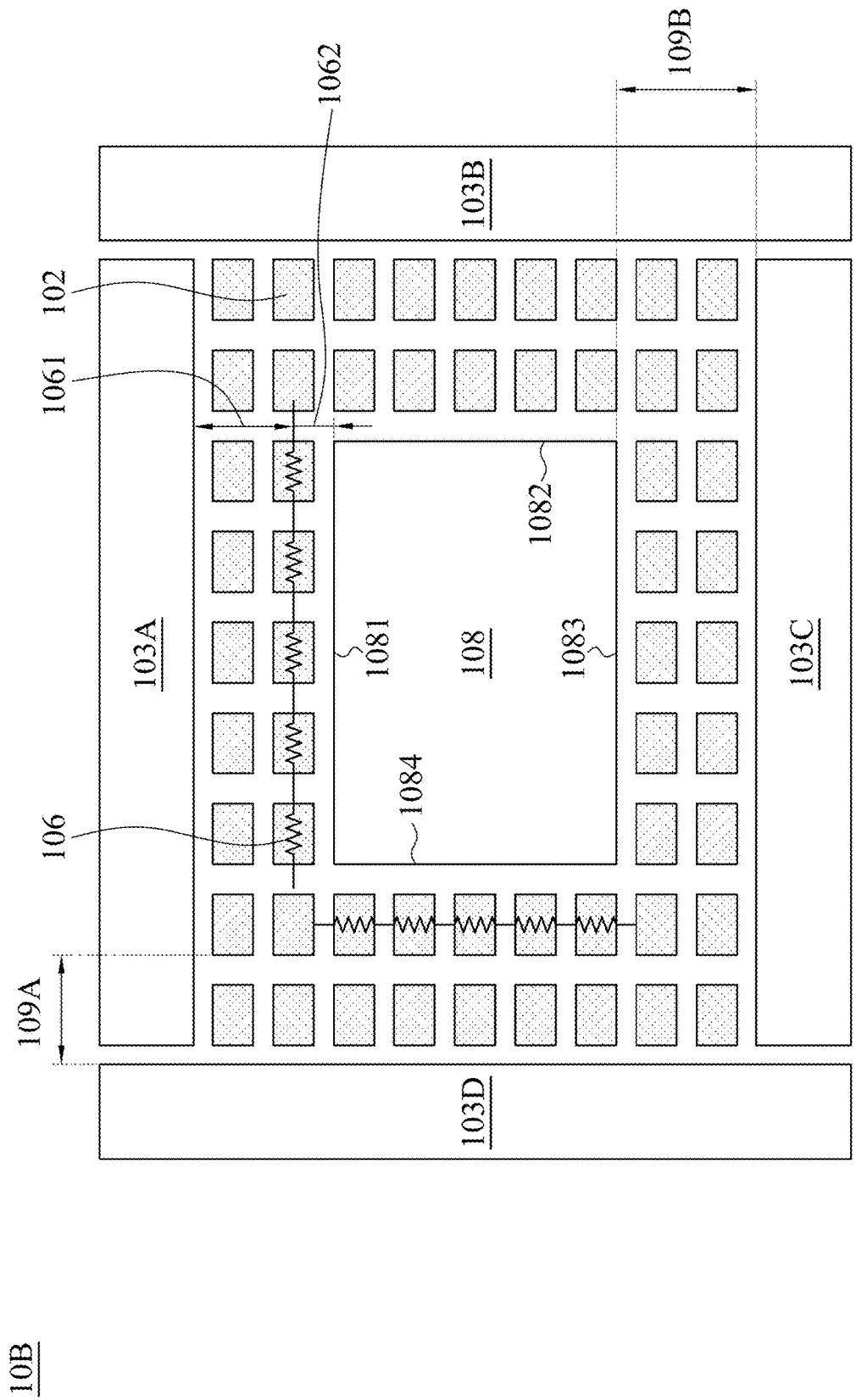
FIG. 1C is a schematic diagram of a semiconductor layout for ESD protection, in accordance with some embodiments of the present disclosure.

FIG. 1C is a schematic diagram of a semiconductor layout 10B for ESD protection, in accordance with some embodiments of the present disclosure. In some embodiments, the semiconductor layout 10B may correspond to the ESD protection circuit 10 of FIG. 1A or the ESD protection circuit 10A of FIG. 1B.

As shown in FIG. 1C, in some embodiments, the semiconductor layout 10B may include a MOS transistor 108, a resistor 106, a dummy structure 102 and a plurality of core circuits 103A, 103B, 103C and 103D. In some embodiments, the MOS transistor 108 and the resistor 106 can be included by an ESD protection circuit.

In some embodiments, the semiconductor layout 10B can be of a rectangle shape or a square shape. In some embodiments, the MOS transistor 108 may be formed in a central region of the semiconductor layout 10B. In some embodiments, the core circuits 103A to 103D may be formed in a peripheral region or an edge region of the semiconductor layout 10B. The MOS transistor 108 can be surrounded or encircled by the core circuits 103A to 103D. The MOS transistor 108 can be spaced apart from the core circuits 103A to 103D.

In other words, the MOS transistor 108 is not in direct contact with the core circuits 103A to 103D. There may be at least a keep-out area or a gap 109A/109B between the MOS transistor 108A and the core circuits 103A to 103D. As a result, the core circuits 103A to 103D will not be affected or interfered by the MOS transistor 108A during operation. Moreover, the keep-out area can be used to prevent latch up issues, in which electrical circuits or components might be damaged when a high ESD current occurs.

In some embodiments, the keep-out area can be filled with or occupied by the dummy structure 102. In some embodiments, the dummy structure 102 can be arranged between the MOS transistor 108 and the core circuits 103A to 103D. The MOS transistor 108 can be surrounded, compassed or encircled by the dummy structure 102. The dummy structure 102 can be surrounded, compassed or encircled by the core circuits 103A to 103D.

In some embodiments, the resistor 106 can overlap the dummy structure 102. The resistor 106 may include at least one component, layer, material, region, area, structure or section of the dummy structure 102. In some embodiments, the resistor 106 can be adjacent to the MOS transistor 108. The resistor 106 can be adjacent to one or several edges of the MOS transistor 108.

More specifically, in some embodiments as shown in FIG. 1C, the resistor 106 can be separated from the core circuit 103A with a distance 1061. The resistor 106 can be separated from the MOS transistor 108 with a distance 1062. In some embodiments, the distance 1061 can be greater than the distance 1062. That is, the distance between the resistor 106 and the MOS transistor 108 can be smaller than that between the resistor 106 and the core circuit 103A.

As shown in FIG. 1C, the resistor 106 may be formed along or adjacent to the edge 1081 of the MOS transistor 108. The resistor 106 can cover a portion of the edge 1081 or the entire edge 1081. The resistor 106 may be formed along or adjacent to the edge 1084 of the MOS transistor 108. The resistor 106 can cover a portion of the edge 1084 or the entire edge 1084. Therefore, a gap 109A on the dummy structure 102 can be arranged between the core circuit 103D and the resistor 106 of the ESD protection circuit.

In some embodiments, the resistor 106 may not be formed along or adjacent to the edge 1082 of the MOS transistor 108. The resistor 106 may not be formed along or adjacent to the edge 1083 of the MOS transistor 108. Accordingly, a gap 109B on the dummy structure 102 can be arranged between the core circuit 103C and the resistor 106 of the ESD protection circuit.

As illustrated in FIG. 1C, the gap 109A is smaller than the gap 109B, because the resistor 106 is formed close to the edge 1084 but not close to the edge 1083. Therefore, certain electrical components or elements with high sensitivity can be formed by the core circuit 103C due to the large gap 109B from the ESD protection circuit. Certain electrical components or elements with low sensitivity can be formed by the core circuit 103D due to the small gap 109A from the ESD protection circuit.

Figure 1D:
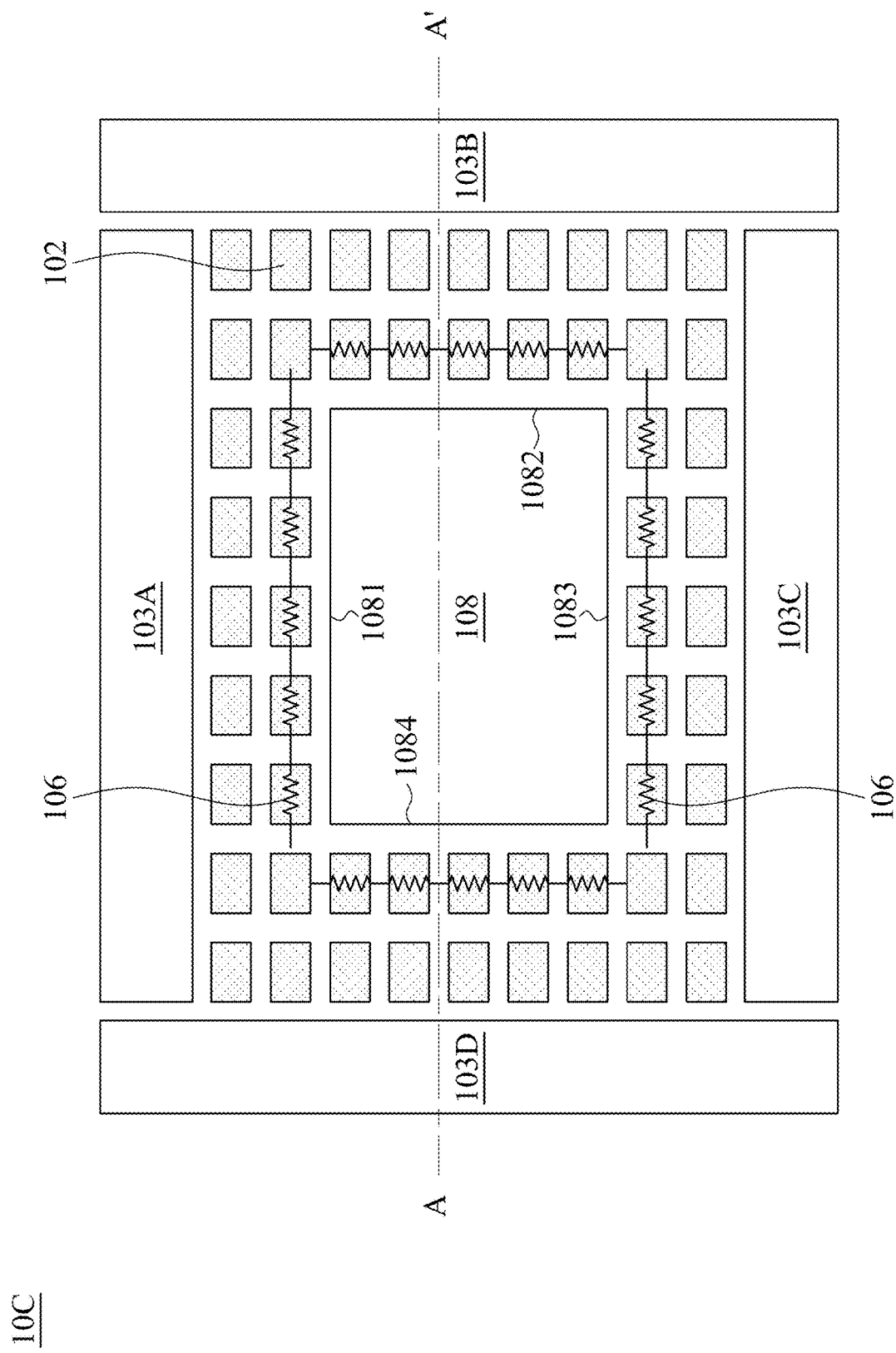
FIG. 1D is another schematic diagram of a semiconductor layout for ESD protection, in accordance with some embodiments of the present disclosure.

FIG. 1D is another schematic diagram of the semiconductor layout 10C for ESD protection, in accordance with some embodiments of the present disclosure. The ESD protection circuit 10C of FIG. 1D is similar to the ESD protection circuit 10B of FIG. 1C, except for the differences described as follows.

As shown in FIG. 1D, the MOS transistor 108 may be surrounded or encircled by the resistor 106. In some embodiments, the resistor 106 can be formed adjacent to or along with each one of the edges 1081 to 1084 of the MOS transistor 108. In some embodiments, the distances between the resistor 106 and each of the core circuits 103A, 103B, 103C and 103D could be substantially the same.

Figure 1E:
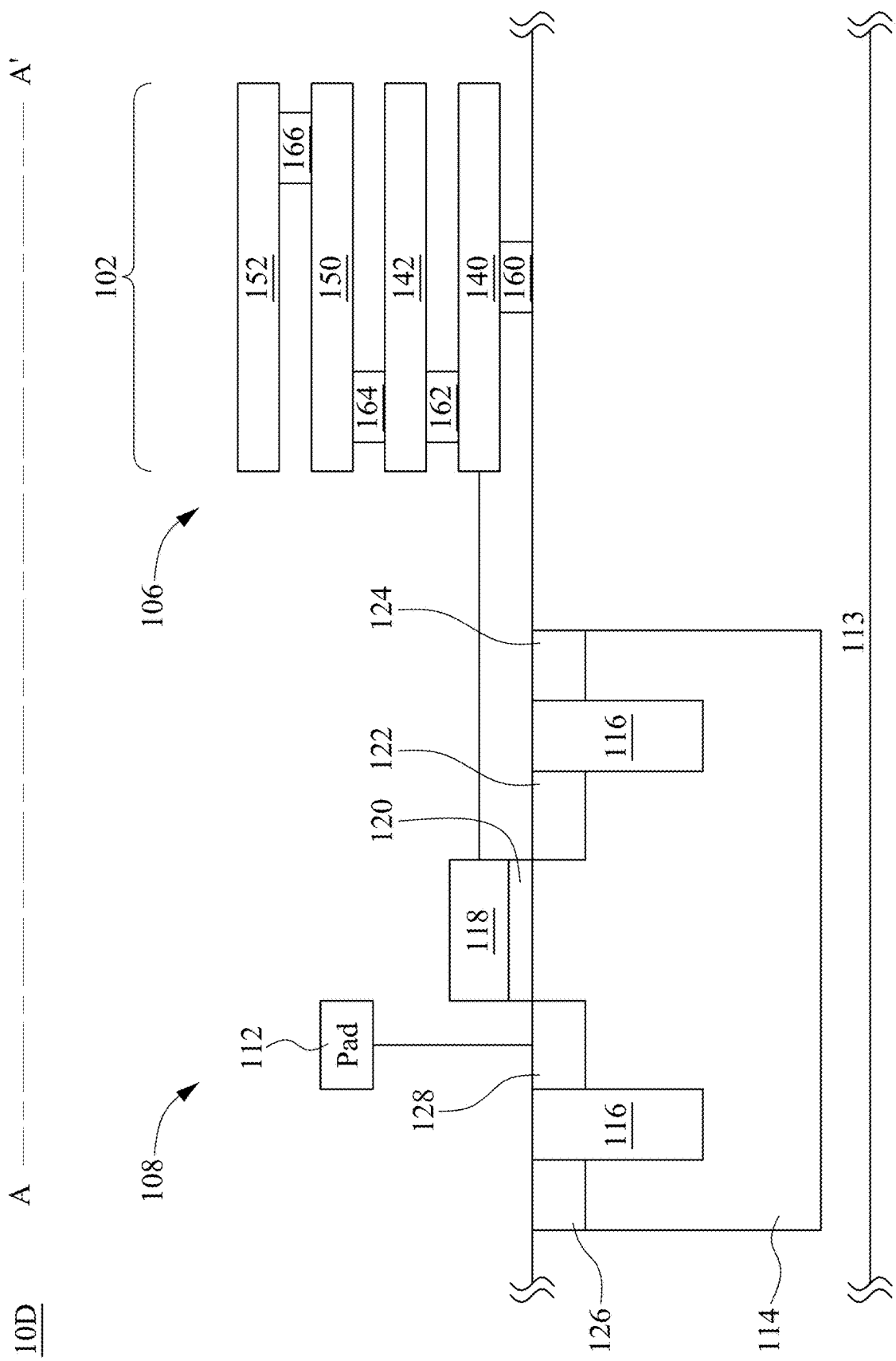
FIG. 1E is a schematic diagram illustrating a cross-sectional view of a semiconductor layout for ESD protection, in accordance with some embodiments of the present disclosure.

FIG. 1E is a schematic diagram illustrating a cross-sectional view of a semiconductor device 10D for ESD protection, in accordance with some embodiments of the present disclosure. In some embodiments, the semiconductor device 10D of FIG. 1E can correspond to a cross-section of the semiconductor layout 10C along the section line A-A' in FIG. 1D.

As shown in FIG. 1E, the semiconductor device 10D may include a MOS transistor 108 and a dummy structure 102. In some embodiments, the semiconductor device 10D can include a pad 112, a substrate 113, a first doped region 114, two isolating structures 116, a gate 118, a dielectric layer 120, several second doped regions 122 to 128, poly layers 140 and 142, metal layers 150 and 152, and several connecting structures 162 to 166.

The substrate 113 may include a semiconductor substrate. In some embodiments, the substrate 113 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 113 may include a layered semiconductor such as silicon/silicon germanium, silicon-on-insulator, or silicon germanium-on-insulator.

The first doped region 114 can be formed on the substrate 113. The first doped region 114 may be doped with an N-type dopant such as phosphorus (P), arsenic (As), or antimony (Sb). In some other embodiments, the first doped region 114 may be doped with a P-type dopant such as boron (B) or indium (In). In some embodiments, the substrate 113 may be or include an unimplanted area. In some embodiments, the first doped region 114 may have a higher doping concentration than the substrate 113.

In some embodiments, the first doped region 114 may include a substantially constant doping concentration. In some embodiments, the first doped region 114 may include a step, gradient, or other doping profile. For example, the first doped region 114 may include a gradually changing doping concentration.

The isolating structure 116 can be formed within the first doped region 114. The isolating structure 116 may be used for electrically isolating the MOS transistor 108 from another MOS transistor. The isolating structure 116 may be used for physically isolating the MOS transistor 108 from another MOS transistor.

In some embodiments, the isolating structure 116 may include, for example, silicon oxide (SiO2), silicon nitride (Si3N4), silicon oxynitride, silicon nitride oxide, a high-k material or combinations thereof. Examples of the high-k material include a dielectric material having a dielectric constant higher than that of silicon dioxide ($SiO_2$), or a dielectric material having a dielectric constant higher than about 3.9. In some embodiments, the isolating structure 116 may include at least one metallic element, such as hafnium oxide (HfO2), silicon doped hafnium oxide (HSO), lanthanum oxide (La2O3), lanthanum aluminum oxide (LaAlO3), zirconium oxide (ZrO2), zirconium orthosilicate (ZrSiO4), aluminum oxide (Al2O3) or combinations thereof.

The gate 118 may be formed above the first doped region 114. The gate 118 may be formed between two isolating structures 116. The gate 118 may be formed on the dielectric layer 120. The gate 118 may include a conductive material. The gate 118 may include a metal. The gate 118 may include, for example, but are not limited to, Al, Ti, AN, TiN or a metal compound.

The dielectric layer 120 may include a gate oxide layer. In some embodiments, the dielectric layer 12d1 may include, for example, silicon oxide (SiO2), silicon nitride (Si3N4), silicon oxynitride (N2OSi2), silicon nitride oxide (N2OSi2), a high-k material or combinations thereof. Examples of the high-k material include a dielectric material having a dielectric constant higher than that of silicon dioxide (SiO2), or a dielectric material having a dielectric constant higher than about 3.9. In some embodiments, the dielectric layer 120 may include at least one metallic element, such as hafnium oxide (HfO2), silicon doped hafnium oxide (HSO), lanthanum oxide (La2O3), lanthanum aluminum oxide (LaAlO3), zirconium oxide (ZrO2), zirconium orthosilicate (ZrSiO4), aluminum oxide (Al2O3) or combinations thereof.

The second doped regions 122 to 128 can be formed within the first doped region 114. One isolating structure 116 is formed between the second doped regions 122 and 124, and another isolating structure 116 is formed between the second doped regions 126 and 128. The second doped regions 122 to 128 may be doped with an N-type dopant such as phosphorus (P), arsenic (As), or antimony (Sb). In some other embodiments, the second doped regions 122 to 128 may be doped with a P-type dopant such as boron (B) or indium (In). In some embodiments, the second doped regions 122 to 128 may have a higher doping concentration than the first doped region 114.

In some embodiments, the second doped regions 122 to 128 may include a substantially constant doping concentration. In some embodiments, the second doped regions 122 to 128 may include a step, gradient, or other doping profile. For example, the second doped regions 122 to 128 may include a gradually changing doping concentration.

In some embodiments, the first doped region 114 may be doped with a P-type dopant. In some embodiments, the second doped region 122 may be doped with an N-type dopant. In some embodiments, the second doped region 124 may be doped with a P-type dopant. In some embodiments, the second doped region 126 may be doped with a P-type dopant. In some embodiments, the second doped region 128 may be doped with an N-type dopant.

In some embodiments, the second doped region 122 may be referred to as a source of the MOS transistor 108, and the second doped region 128 may be referred to as a drain of the MOS transistor 108. In some embodiments, the second doped region 128 may be referred to as a source of the MOS transistor 108, and the second doped region 122 may be referred to as a drain of the MOS transistor 108.

In some embodiments, the dummy structure 102 can include the poly layers 140 and 142, the metal layers 150 and 152, and several connecting structures 162 to 166. In some embodiments, a portion of the dummy structure 102 can be included by the resistor 106. The resistor 106 may include any one of the poly layers 140 and 142, and the metal layers 150 and 152. The resistor 106 may include any two of the poly layers 140 and 142, and the metal layers 150 and 152. The resistor 106 may include any three of the poly layers 140 and 142, and the metal layers 150 and 152. The resistor 106 may include all of the poly layers 140 and 142, and the metal layers 150 and 152. Furthermore, it will be appreciated that the illustrated number or amount of the poly layers and the metal layers in FIG. 1D are not to be interpreted in a limiting sense.

In some embodiments, the metal layers 150 and 152 may include a conductive thin film, and may include, for example, aluminum (Al), copper (Cu), chromium (Cr), tin (Sn), gold (Au), silver (Ag), nickel (Ni) or stainless steel, another metal, or a mixture, an alloy, or other combination of two of more thereof.

The poly layers 140 and 142 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. The poly layers 140 and 142 may include one or more of the following: a resin, a polyester resin, a polyether resin, an epoxy resin and/or a polyolefin composition. The poly layers 140 and 142 may include an epoxy resin having fillers, a molding compound (e.g., an epoxy molding compound or other molding compound), a polyimide, a phenolic compound or material, a material with a silicone dispersed therein, or a combination thereof.

The connecting structures 160 to 166 can be formed to contact and space the poly layers 140 and 142 and the metal layers 150 and 152. As shown in FIG. 1E, the poly layer 140 can be formed on the substrate 113 through the connecting structure 160. The poly layer 142 can be formed on the poly layer 140 through the connecting structure 162. The metal layer 150 can be formed on the poly layer 142 through the connecting structure 164. The metal layer 152 can be formed on the metal layer 150 through the connecting structure 166.

In some embodiments, the resistance value of the metal layers 150 and 152 can be smaller than that of the poly layers 140 and 142. In some embodiments, the resistor 106 can be electrically connected to the MOS transistor 108. Moreover, as shown in FIG. 1E, the poly layer 140 of the resistor 106 can be electrically connected to the gate 118 of the MOS transistor 108. In some embodiments, the dummy structure 102 can be formed between the MOS transistor 108 and the core circuit. Specifically, the MOS transistor 108 may be adjacent to left side of the dummy structure 102, and the core circuit may be adjacent to right side of the dummy structure 102.

In some embodiments, the extending direction of the poly layers 140 and 142 can be substantially the same as that of the metal layers 150 and 152. In some embodiments, the extending direction of the poly layers 140 and 142 can be different from that of the metal layers 150 and 152.

In some embodiments, the extending direction of the poly layers 140 and 142 and the metal layers 150 and 152 can be substantially the same as that of the gate 118 and the dielectric layer 120. In some embodiments, the extending direction of the poly layers 140 and 142 and the metal layers 150 and 152 can be different from that of the gate 118 and the dielectric layer 120. In some embodiments, the extending direction of the poly layers 140 and 142 and the metal layers 150 and 152 can be vertical to that of the gate 118 and the dielectric layer 120.

The connecting structures 160 to 166 may include a metal. The connecting structures 160 to 166 may include, for example, but are not limited to, Al. The connecting structures 160 to 166 may include, for example, but are not limited to, Ti. The connecting structures 160 to 166 may include a metal compound. The connecting structures 160 to 166 may include, for example, but are not limited to, AN. The connecting structures 160 to 166 may include, for example, but are not limited to, TiN.

Figure 1F:
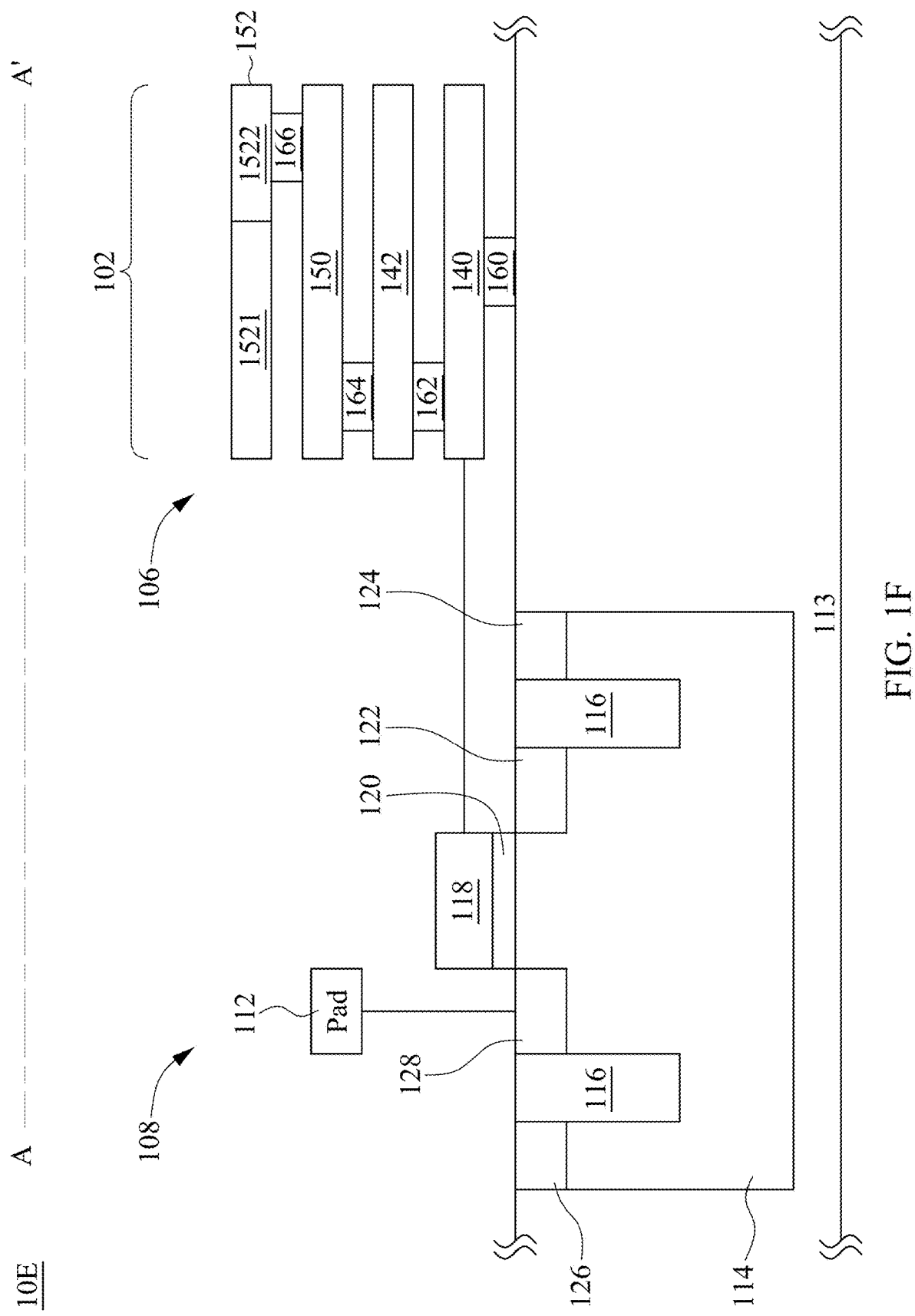
FIG. 1F is another schematic diagram illustrating a cross-sectional view of a semiconductor layout for ESD protection, in accordance with some embodiments of the present disclosure.

FIG. 1F is a schematic diagram illustrating a cross-sectional view of a semiconductor device 10E for ESD protection, in accordance with some embodiments of the present disclosure. In some embodiments, the semiconductor device 10E of FIG. 1F can correspond to a cross-section of the semiconductor layout 10C along the section line A-A' in FIG. 1D.

As shown in FIG. 1F, the metal layer 152 can include two portions 1521 and 1522. In some embodiments, the portion 1521 may be close to or adjacent to the MOS transistor 108. The portion 1522 may be close to or adjacent to the core circuit. In some embodiments, the portion 1521 may be in direct contact with the portion 1522. In some embodiments, a spacing gap can be formed between the portion 1521 and the portion 1522. The spacing gap may include, for example, but not limited to, a conductive material, an insulating material or a combination thereof.

In some embodiments, the portion 1521 of the metal layer 152 can be included by the resistor 106. As shown in FIG. 1F, the resistor 106 can be electrically connected to the MOS transistor 108 for regulating or adjusting the current path of ESD. In some embodiments, a length or area of the portion 1521 may be greater than that of the portion 1522. In some embodiments, a length or area of the portion 1521 may be smaller than that of the portion 1522. In some embodiments, a length or area of the portion 1521 may be substantially the same as that of the portion 1522.

Figure 1G:
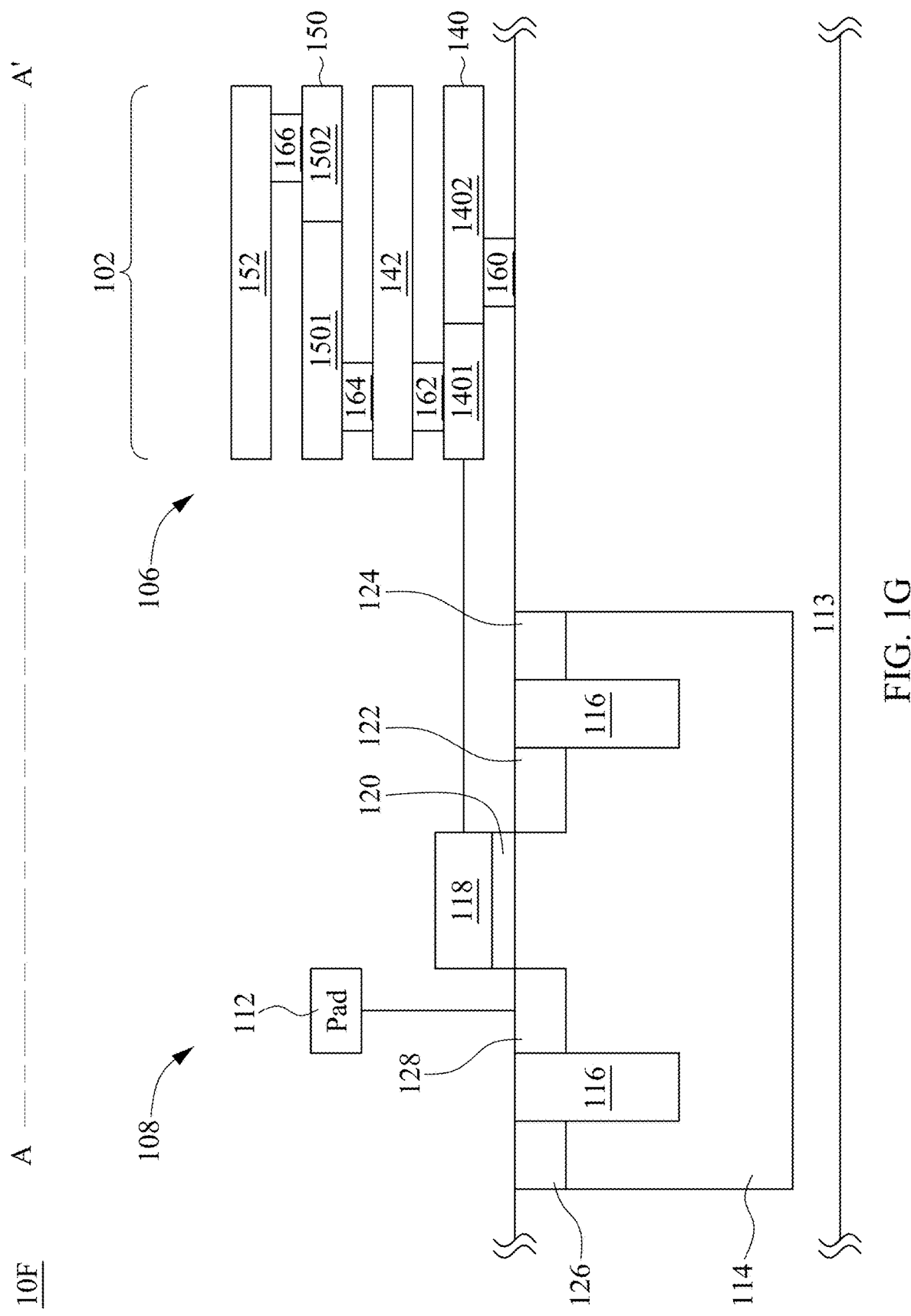
FIG. 1G is another schematic diagram illustrating a cross-sectional view of a semiconductor layout for ESD protection, in accordance with some embodiments of the present disclosure.

FIG. 1G is a schematic diagram illustrating a cross-sectional view of a semiconductor device 10F for ESD protection, in accordance with some embodiments of the present disclosure. In some embodiments, the semiconductor device 10F of FIG. 1G can correspond to a cross-section of the semiconductor layout 10C along the section line A-A' in FIG. 1D.

As shown in FIG. 1G, the resistor 106 can include a portion 1401 of the poly layer 140 and a portion 1501 of the metal layer 150. In some embodiments, the poly layer 140 can include two portions 1401 and 1402. In some embodiments, the portion 1401 may be close to or adjacent to the MOS transistor 108. The portion 1402 may be close to or adjacent to the core circuit. In some embodiments, the portion 1401 may be in direct contact with the portion 1402. In some embodiments, a spacing gap can be formed between the portion 1401 and the portion 1402. The spacing gap may include, for example, but not limited to, a conductive material, an insulating material or a combination thereof.

In some embodiments, the portion 1401 of the poly layer 140 can be included by the resistor 106. As shown in FIG. 1G, the resistor 106 can be electrically connected to the MOS transistor 108 for regulating or adjusting the current path of ESD. In some embodiments, a length or area of the portion 1401 may be smaller than that of the portion 1402. In some embodiments, a length or area of the portion 1401 may be greater than that of the portion 1402. In some embodiments, a length or area of the portion 1401 may be substantially the same as that of the portion 1402.

Furthermore, in some embodiments, the metal layer 150 can include two portions 1501 and 1502. In some embodiments, the portion 1501 may be close to or adjacent to the MOS transistor 108. The portion 1502 may be close to or adjacent to the core circuit. In some embodiments, the portion 1501 may be in direct contact with the portion 1502. In some embodiments, a spacing gap can be formed between the portion 1501 and the portion 1502. The spacing gap may include, for example, but not limited to, a conductive material, an insulating material or a combination thereof.

In some embodiments, the portion 1501 of the metal layer 150 can be included by the resistor 106. As shown in FIG. 1G, the resistor 106 can be electrically connected to the MOS transistor 108 for regulating or adjusting the current path of ESD. In some embodiments, a length or area of the portion 1501 may be substantially the same as that of the portion 1502. In some embodiments, a length or area of the portion 1501 may be greater than that of the portion 1502. In some embodiments, a length or area of the portion 1501 may be smaller than that of the portion 1502.

When an ESD current flows through the resistor 106, due to its resistance, it generates a bias thereacross. This bias helps to turn on the MOS transistor 108, and creates a surface current path under the dielectric layer 120, in addition to the substrate current path that is created by the avalanche breakdown across the source and the drain of the second doped regions 122 and 128. As a result, the core circuit can be protected by dispersing or carrying charges through the created current path by the MOS transistor 108 in association with the resistor 106.

Figure 2A:
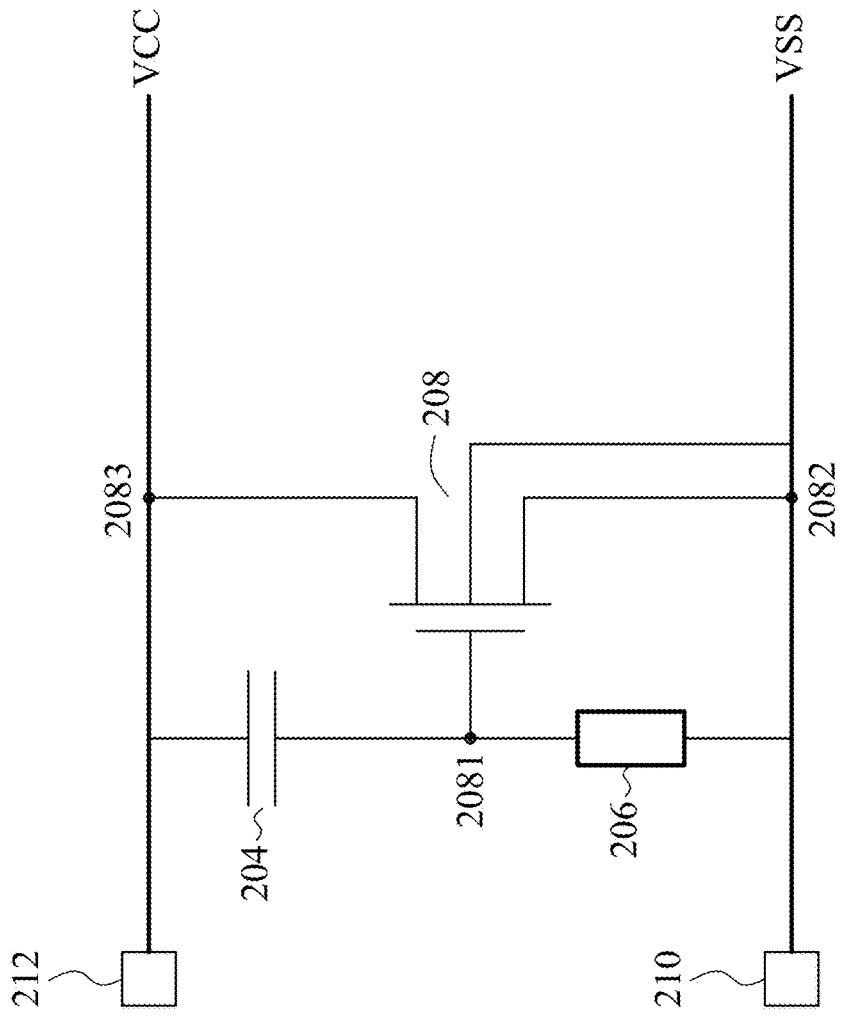
FIG. 2A is a schematic diagram of an ESD protection circuit, in accordance with some embodiments of the present disclosure.

FIG. 2A is a schematic diagram of an ESD protection circuit 20, in accordance with some embodiments of the present disclosure. Referring to FIG. 2A, the ESD protection circuit 20 may include a capacitor 204, a resistor 206 and a MOS transistor 208. The ESD protection circuit 20 can be used to protect a core circuit from being damaged during an ESD event. The capacitor 204 of the ESD protection circuit 20 can be used to store or accumulate charges when the ESD event occurs. As a result, the performance on preventing the core circuit form deteriorated or degenerated can be enhanced.

In some embodiments, the capacitor 204 can be electrically connected between the gate 2081 of the MOS transistor 208 and the pad 212. The capacitor 204 can also be electrically connected between the gate 2081 of the MOS transistor 208 and the voltage source VCC. The capacitor 204 can also be electrically connected between the gate 2081 of the MOS transistor 208 and the drain 2083 of the MOS transistor 208. It can be understood by those skilled in the art that the voltage source VCC refers to the operation voltage of the ESD protection circuit 20.

In some embodiments, the resistor 206 can be electrically connected between the gate 2081 of the MOS transistor 208 and the pad 210. The resistor 206 can also be electrically connected between the gate 2081 of the MOS transistor 208 and the voltage source VSS. It can be understood by those skilled in the art that the voltage source VSS refers to the operation voltage of the ESD protection circuit 20.

In some embodiments, the drain 2083 of the MOS transistor 208 can be electrically connected to the pad 212. The drain 2083 of the MOS transistor 208 can be electrically connected to the voltage source VCC.

In some embodiments, the source 2082 of the MOS transistor 208 can be electrically connected to the pad 210. The source 2082 of the MOS transistor 208 can be electrically connected to the resistor 206. The source 2082 of the MOS transistor 208 can further be electrically connected to the voltage source VSS.

Figure 2B:
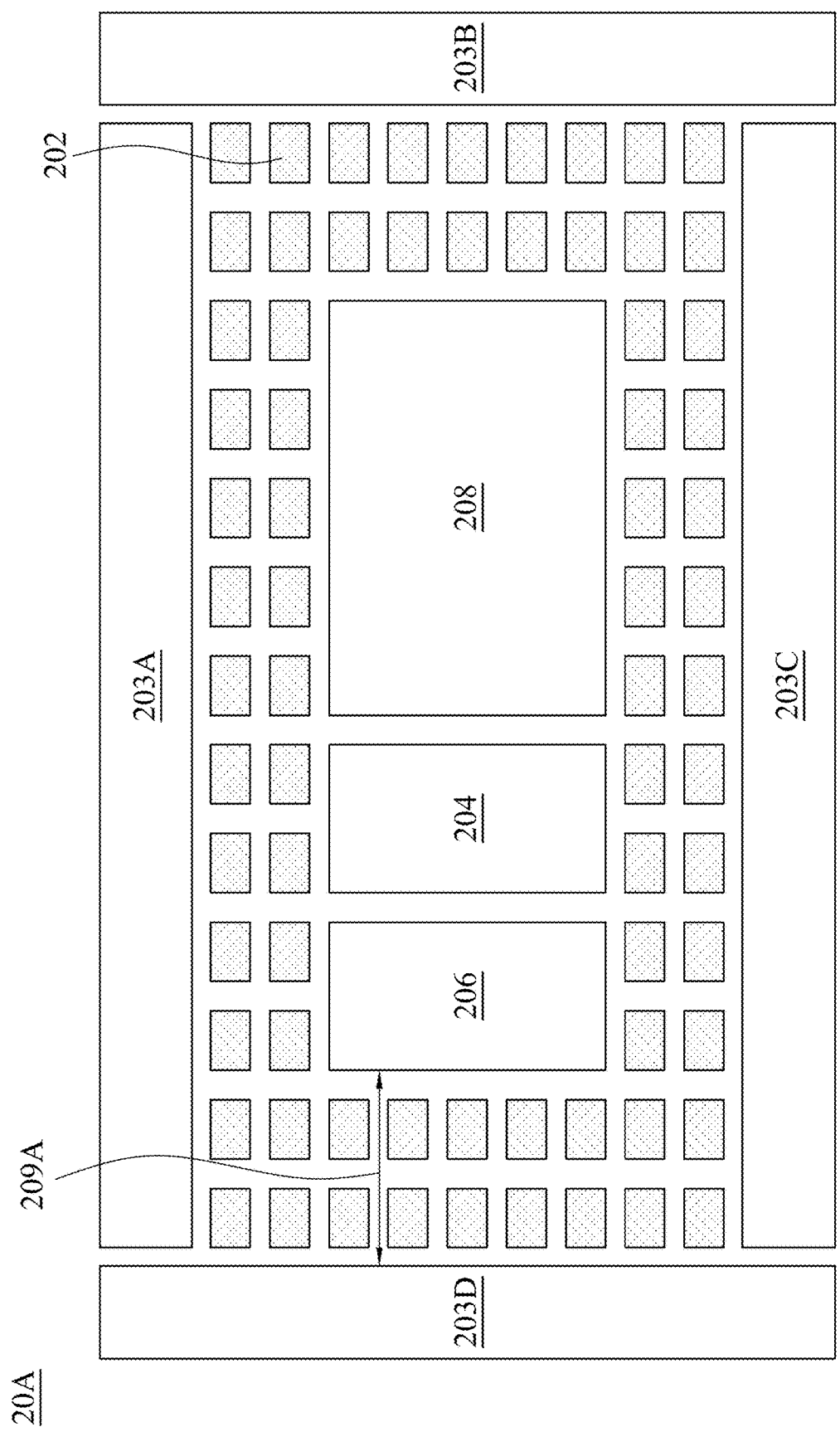
FIG. 2B is a schematic diagram of a semiconductor layout for ESD protection, in accordance with some comparative embodiments of the present disclosure.

FIG. 2B is a schematic diagram of a semiconductor layout 20A for ESD protection, in accordance with some comparative embodiments of the present disclosure. In some embodiments, the semiconductor layout 20A may correspond to the ESD protection circuit 20 as illustrated in FIG. 2A.

As shown in FIG. 2B, in some embodiments, the semiconductor layout 20A may include a MOS transistor 208, a resistor 206, a capacitor 204, a dummy structure 202 and a plurality of core circuits 203A to 203D. In some embodiments, the MOS transistor 208, the capacitor 204, and the resistor 206 can be included by an ESD protection circuit.

In some embodiments, the semiconductor layout 20A can be of a rectangle shape or a square shape. In some embodiments, the MOS transistor 208 may be formed in a central region of the semiconductor layout 20A. In some embodiments, the core circuits 203A to 203D may be formed in a peripheral region or an edge region of the semiconductor layout 20A. The MOS transistor 208 can be disposed in a region of a substantial rectangle shape. The MOS transistor 208 can be surrounded or encircled by the core circuits 203A to 203D. The MOS transistor 208 can be spaced apart from the core circuits 203A to 203D.

In other words, the MOS transistor 208 is not in direct contact with the core circuits 203A to 203D. There is a keep-out area or a gap 209A between the MOS transistor 208A and the core circuits 203A to 203D. As a result, the core circuits 203A to 203D will not be affected or interfered by the MOS transistor 208A during operation. Moreover, the keep-out area can be used to prevent latch up issues, in which electrical circuits or components might be damaged when a high ESD current occurs.

In some embodiments, the keep-out area can be filled with or occupied by the dummy structure 202. In some embodiments, the dummy structure 202 can be arranged between the MOS transistor 208 and the core circuits 203A to 203D. The MOS transistor 208 can be surrounded or encircled by the dummy structure 202. The dummy structure 202 can be surrounded or encircled by the core circuits 203A to 203D.

However, the semiconductor layout 20A may occupy a quite large area due to layouts of the resistor 206, the capacitor 204 and the MOS transistor 208 of the ESD protection circuit. Although a gap 209A overlapping the dummy structure 202 may be created between the core circuit 203D and the ESD protection circuit, the occupied area may not be decreased because the dummy structure 202 is required but not be used as or included by at least a portion of the ESD protection circuit.

Figure 2C:
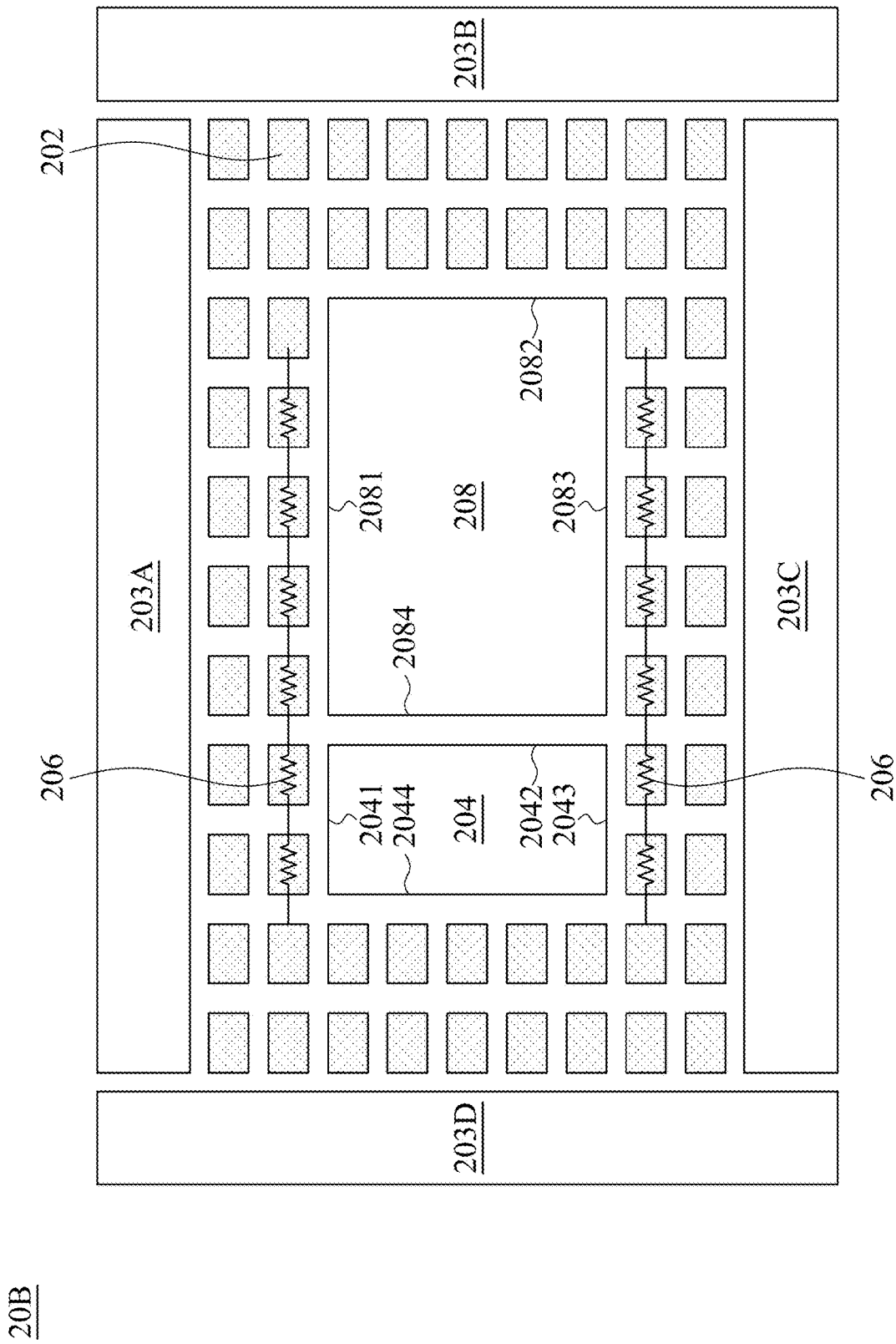
FIG. 2C is another schematic diagram of a semiconductor layout for ESD protection, in accordance with some embodiments of the present disclosure.

FIG. 2C is another schematic diagram of a semiconductor layout 20B for ESD protection, in accordance with some embodiments of the present disclosure. The semiconductor layout 20B of FIG. 2C is similar to the semiconductor layout 20A of FIG. 2B, except for the differences described as follows.

In some embodiments, when an ESD event occurs on the core circuits 203A to 203D, as shown in FIG. 2C, a layout of the MOS transistor 208 could be spaced apart from a layout of the core circuit 203A to 203D by a layout of a dummy structure 202. In some embodiments, the resistor 206 can be formed by utilizing a portion of the dummy structure 202.

In some embodiments, the capacitor 204 can be disposed in a region of a substantial rectangle shape. As shown in FIG. 2C, the capacitor 204 may include four edges 2041, 2042, 2043 and 2044. The edge 2041 can be adjacent to or facing toward the core circuit 203A. The edge 2042 can be adjacent to or facing toward the MOS transistor 208 and the core circuit 203B. The edge 2043 can be adjacent to or facing toward the core circuit 203C. The edge 2044 can be adjacent to or facing toward the core circuit 203D.

In some embodiments, the MOS transistor 208 may include four edges 2081, 2082, 2083 and 2084. The edge 2081 can be adjacent to or facing toward the core circuit 203A. The edge 2082 can be adjacent to or facing toward the core circuit 203B. The edge 2083 can be adjacent to or facing toward the core circuit 203C. The edge 2084 can be adjacent to or facing toward the capacitor 204 and the core circuit 203D.

A portion of the resistor 206 can be formed along or adjacent to the edges 2041 and 2081. Another portion of the resistor 206 can be formed along or adjacent to the edges 2043 and 2083. In some embodiments, the resistor 206 may be far away from the edge 2044 of the capacitor 204. In some embodiments, the resistor 206 may be far away from the edge 2082 of the MOS transistor 208.

In some embodiments, one or several portions of the dummy structure 202 can be used as or included by the resistor 206. In other words, the resistor 206 can be overlapped or incorporated into the dummy structure 202. Accordingly, it is unnecessary to occupy an area of a layout of substantial rectangle shape for the resistor 206. Therefore, the area of the semiconductor layout 20B can be reduced.

Figure 2D:
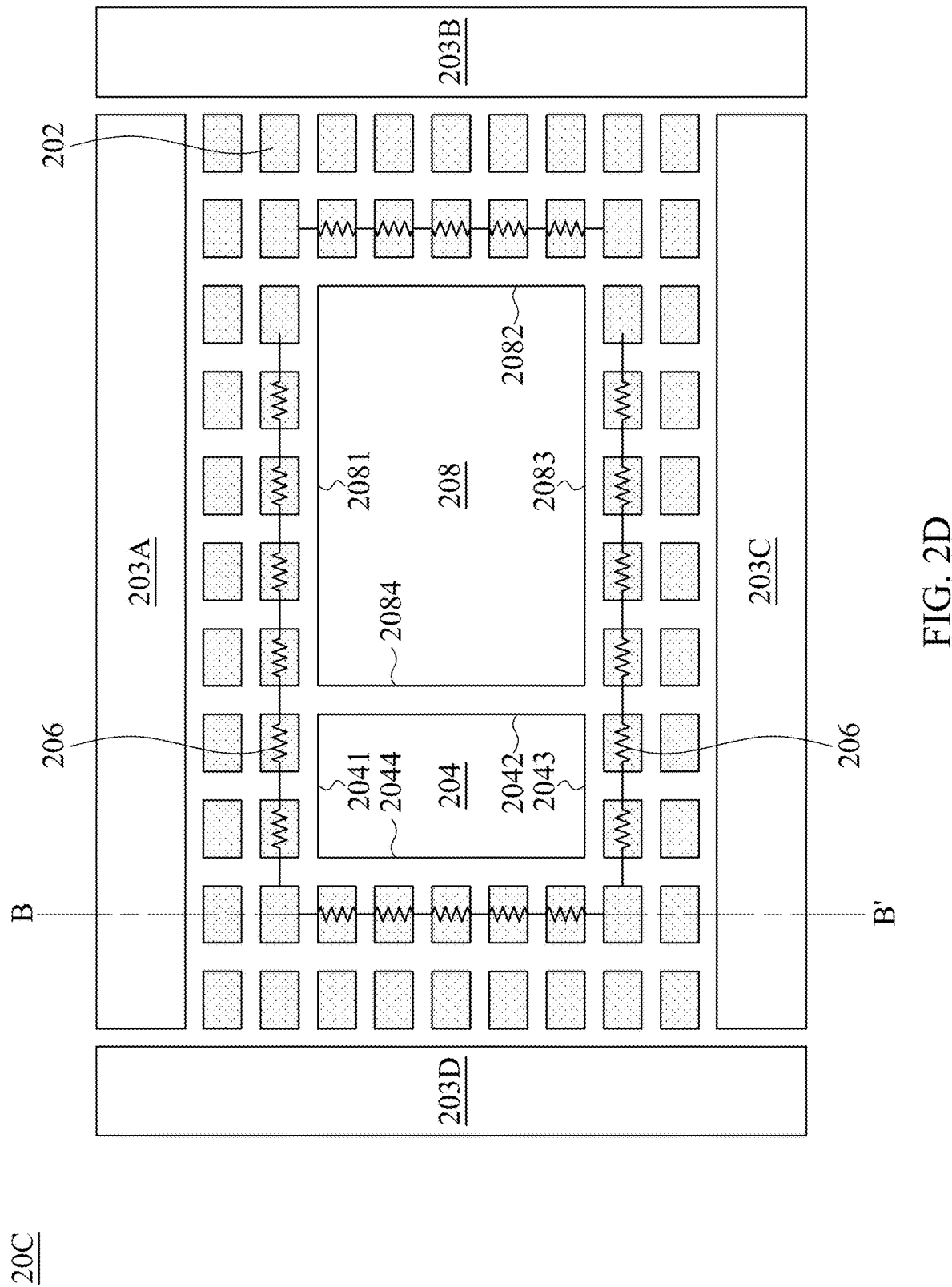
FIG. 2D is another schematic diagram of a semiconductor layout for ESD protection, in accordance with some embodiments of the present disclosure.

FIG. 2D is another schematic diagram of a semiconductor layout 20C for ESD protection, in accordance with some embodiments of the present disclosure. The semiconductor layout 20C of FIG. 2D is similar to the semiconductor layout 20B of FIG. 2C, except for the differences described as follows.

In some embodiments, the resistor 206 can be formed by overlapping a portion of the dummy structure 202 close the capacitor 204 and the MOS transistor 208. In some embodiments, the resistor 206 may encircle the capacitor 204 and the MOS transistor 208. In some embodiments, the entire capacitor 204 and the entire MOS transistor 208 may be surrounded by the resistor 206. As shown in FIG. 2D, the resistor 206 may be formed along the edges 2041, 2043, 2044, 2081, 2082 and 2083.

In some embodiments, the resistor 206 may be formed along substantially 100% of the edges of the capacitor 204 and the MOS transistor 208. In some embodiments, the resistor 206 may be formed along more than 90% of the edges of the capacitor 204 and the MOS transistor 208. In some embodiments, the resistor 206 may be formed along more than 70% of the edges of the capacitor 204 and the MOS transistor 208. In some embodiments, the resistor 206 may be formed along more than 50% of the edges of the capacitor 204 and the MOS transistor 208. In some embodiments, the resistor 206 may be formed along more than 30% of the edges of the capacitor 204 and the MOS transistor 208. In some embodiments, the resistor 206 may be formed along more than 10% of the edges of the capacitor 204 and the MOS transistor 208.

In some embodiments, one or several portions of the dummy structure 202 can be used as or included by the resistor 206. In other words, the resistor 206 can be overlapped or incorporated into the dummy structure 202. Accordingly, it is unnecessary to occupy an area of a layout of substantial rectangle shape for the resistor 206. Therefore, the area of the semiconductor layout 20C can be reduced.

Figure 2E:
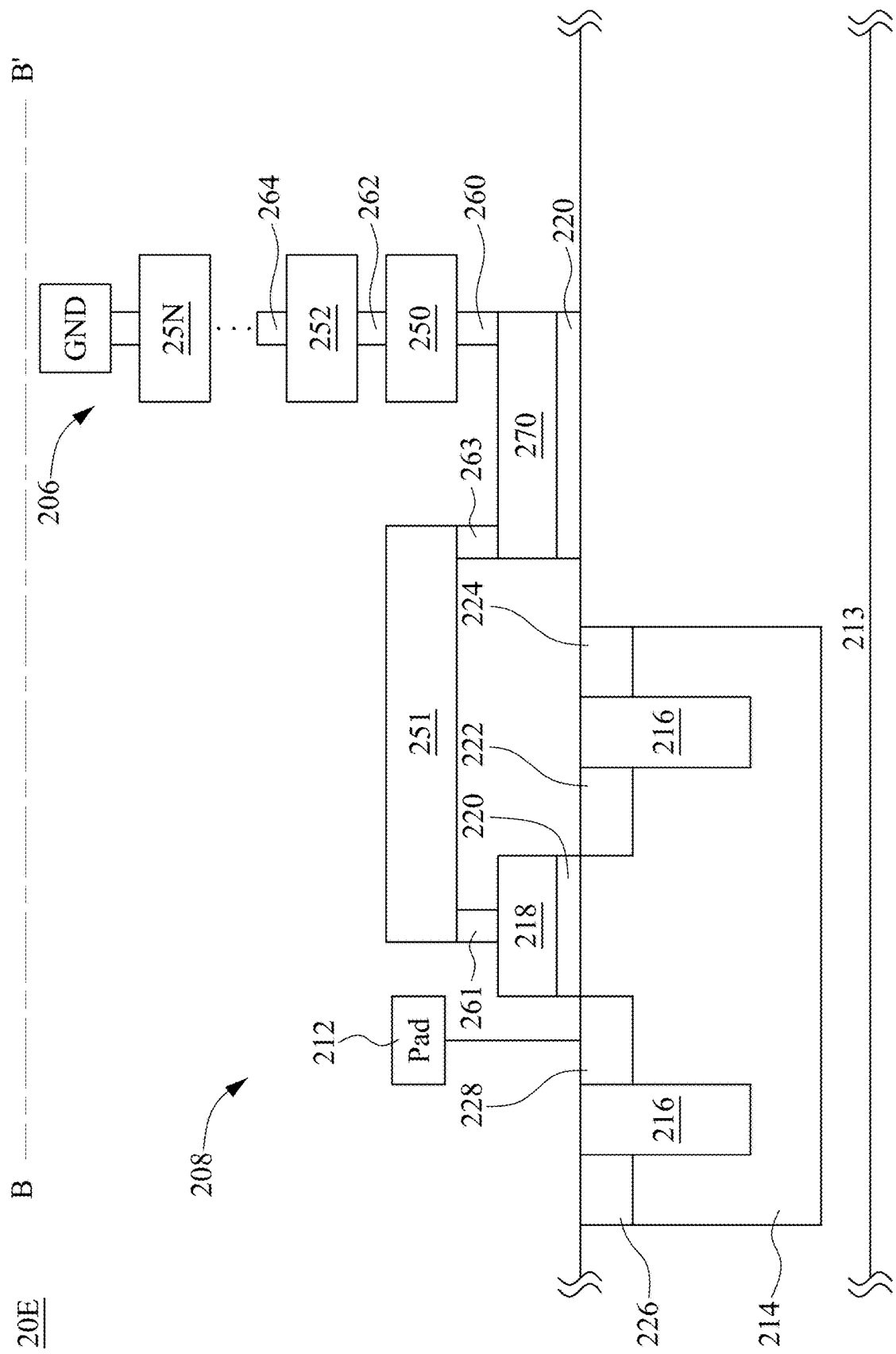
FIG. 2E is a schematic diagram illustrating a cross-sectional view of a semiconductor layout for ESD protection, in accordance with some embodiments of the present disclosure.

FIG. 2E is a schematic diagram illustrating a cross-sectional view of a semiconductor device 20E for ESD protection, in accordance with some embodiments of the present disclosure. In some embodiments, the semiconductor device 20E of FIG. 2E can correspond to a cross-section of the semiconductor layout 20C along the section line B-B' in FIG. 2D.

As shown in FIG. 2E, the semiconductor device 20E may include a MOS transistor 208 and a resistor 206. In some embodiments, the semiconductor device 20D can include a pad 212, a substrate 213, a first doped region 214, two isolating structures 216, a gate 218, a dielectric layer 220, several second doped regions 222 to 228, metal layers 250 to 25N, a poly layer 270, and several connecting structures 260 to 265.

The substrate 213 may include a semiconductor substrate. In some embodiments, the substrate 213 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 213 may include a layered semiconductor such as silicon/silicon germanium, silicon-on-insulator, or silicon germanium-on-insulator.

The first doped region 214 can be formed on the substrate 213. The first doped region 214 may be doped with an N-type dopant such as phosphorus (P), arsenic (As), or antimony (Sb). In some other embodiments, the first doped region 214 may be doped with a P-type dopant such as boron (B) or indium (In). In some embodiments, the substrate 213 may be or include an unimplanted area. In some embodiments, the first doped region 214 may have a higher doping concentration than the substrate 213.

In some embodiments, the first doped region 214 may include a substantially constant doping concentration. In some embodiments, the first doped region 214 may include a step, gradient, or other doping profile. For example, the first doped region 214 may include a gradually changing doping concentration.

The isolating structure 216 can be formed within the first doped region 214. The isolating structure 216 may be used for electrically isolating the MOS transistor 208 from another MOS transistor. The isolating structure 216 may be used for physically isolating the MOS transistor 208 from another MOS transistor.

In some embodiments, the isolating structure 216 may include, for example, silicon oxide (SiO2), silicon nitride (Si3N4), silicon oxynitride, silicon nitride oxide, a high-k material or combinations thereof. Examples of the high-k material include a dielectric material having a dielectric constant higher than that of silicon dioxide (SiO2), or a dielectric material having a dielectric constant higher than about 3.9. In some embodiments, the isolating structure 216 may include at least one metallic element, such as hafnium oxide (HfO2), silicon doped hafnium oxide (HSO), lanthanum oxide (La2O3), lanthanum aluminum oxide (LaAlO3), zirconium oxide (ZrO2), zirconium orthosilicate (ZrSiO4), aluminum oxide (Al2O3) or combinations thereof.

The gate 218 may be formed above the first doped region 214. The gate 218 may be formed between two isolating structures 216. The gate 218 may be formed on the dielectric layer 220. The gate 218 may include a conductive material. The gate 218 may include a metal. The gate 218 may include, for example, but are not limited to, Al, Ti, AN, TiN or a metal compound.

The dielectric layer 220 may include a gate oxide layer. In some embodiments, the dielectric layer 220 may include, for example, silicon oxide (SiO2), silicon nitride (Si3N4), silicon oxynitride (N2OSi2), silicon nitride oxide (N2OSi2), a high-k material or combinations thereof. Examples of the high-k material include a dielectric material having a dielectric constant higher than that of silicon dioxide (SiO2), or a dielectric material having a dielectric constant higher than about 3.9. In some embodiments, the dielectric layer 220 may include at least one metallic element, such as hafnium oxide (HfO2), silicon doped hafnium oxide (HSO), lanthanum oxide (La2O3), lanthanum aluminum oxide (LaAlO3), zirconium oxide (ZrO2), zirconium orthosilicate (ZrSiO4), aluminum oxide (Al2O3) or combinations thereof.

The second doped regions 222 to 228 can be formed within the first doped region 214. One isolating structure 216 is formed between the second doped regions 222 and 224, and another isolating structure 216 is formed between the second doped regions 226 and 228. The second doped regions 222 to 228 may be doped with an N-type dopant such as phosphorus (P), arsenic (As), or antimony (Sb). In some other embodiments, the second doped regions 222 to 228 may be doped with a P-type dopant such as boron (B) or indium (In). In some embodiments, the second doped regions 222 to 228 may have a higher doping concentration than the first doped region 214.

In some embodiments, the second doped regions 222 to 228 may include a substantially constant doping concentration. In some embodiments, the second doped regions 222 to 228 may include a step, gradient, or other doping profile. For example, the second doped regions 222 to 228 may include a gradually changing doping concentration.

In some embodiments, the first doped region 214 may be doped with a P-type dopant. In some embodiments, the second doped regions 222 to 228 may be doped with an N-type dopant. In some embodiments, the second doped region 224 may be doped with a P-type dopant. In some embodiments, the second doped region 226 may be doped with a P-type dopant. In some embodiments, the second doped region 228 may be doped with an N-type dopant.

In some embodiments, the second doped region 222 may be referred to as a source of the MOS transistor 208, and the second doped region 228 may be referred to as a drain of the MOS transistor 208. In some embodiments, the second doped region 228 may be referred to as a source of the MOS transistor 208, and the second doped region 222 may be referred to as a drain of the MOS transistor 208.

In some embodiments, the dummy structure 202 can include the poly layer 270, the metal layers 250 to 25N, and several connecting structures 260 to 264. In some embodiments, a portion of the dummy structure 202 can be included by the resistor 206. In some embodiments, the resistor 206 may include the poly layer 270.

In some embodiments, the resistor 206 may include the poly layer 270 and any one of the metal layers 250 to 25N. The resistor 206 may include any two of the poly layer 270 and the metal layers 250 to 25N. The resistor 206 may include any three of the poly layer 270 and the metal layers 250 to 25N. The resistor 206 may include all of the poly layer 270 and the metal layers 250 to 25N. Furthermore, it will be appreciated that the illustrated number or amount of the poly layers and the metal layers in FIG. 2E are not to be interpreted in a limiting sense.

In some embodiments, the metal layers 250 to 25N may include a conductive thin film, and may include, for example, aluminum (Al), copper (Cu), chromium (Cr), tin (Sn), gold (Au), silver (Ag), nickel (Ni) or stainless steel, another metal, or a mixture, an alloy, or other combination of two of more thereof.

The poly layer 270 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. The poly layer 270 may include one or more of the following: a resin, a polyester resin, a polyether resin, an epoxy resin and/or a polyolefin composition. The poly layer 270 may include an epoxy resin having fillers, a molding compound (e.g., an epoxy molding compound or other molding compound), a polyimide, a phenolic compound or material, a material with a silicone dispersed therein, or a combination thereof.

The connecting structures 260 to 264 can be formed to contact and space the poly layer 270 and the metal layers 250 to 25N. As shown in FIG. 2E, the poly layer 270 can be formed on the substrate 223 through the dielectric structure 220.

Furthermore, the metal layer 251 can be formed on the gate 218 and the poly layer 270 through the connecting structures 261 and 263 respectively. The metal layer 250 can be formed on the poly layer 270 through the connecting structure 260. The metal layer 252 can be formed on the metal layer 250 through the connecting structure 262. The metal layer 25N can be formed on the metal layer 252 through the connecting structure 264 and other connecting structures.

In some embodiments, the resistance value of the metal layers 250 to 25N can be smaller than that of the poly layer 270. In some embodiments, the extending direction of the poly layer 270 can be substantially the same as that of the metal layers 250 to 25N. In some embodiments, the extending direction of the poly layer 270 can be different from that of the metal layers 250 to 25N.

In some embodiments, the extending direction of the poly layer 270 and the metal layers 250 to 25N can be substantially the same as that of the gate 218 and the dielectric layer 220. In some embodiments, the extending direction of the poly layer 270 and the metal layers 250 to 25N can be different from that of the gate 218 and the dielectric layer 220. In some embodiments, the extending direction of the poly layer 270 and the metal layers 250 to 25N can be vertical to that of the gate 218 and the dielectric layer 220.

The connecting structures 260 to 26N may include a metal. The connecting structures 260 to 26N may include, for example, but are not limited to, Al. The connecting structures 260 to 26N may include, for example, but are not limited to, Ti. The connecting structures 260 to 26N may include a metal compound. The connecting structures 260 to 26N may include, for example, but are not limited to, AN. The connecting structures 260 to 26N may include, for example, but are not limited to, TiN.

Figure 2F:
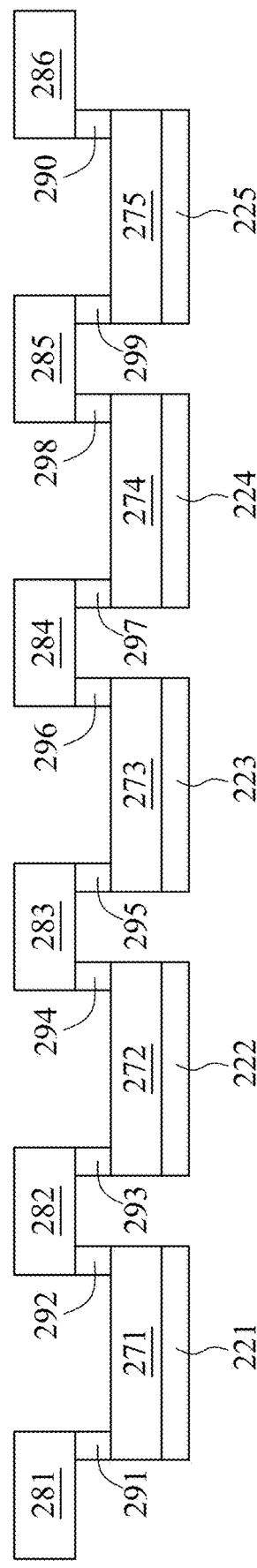
FIG. 2F is a schematic diagram illustrating another cross-sectional view of a semiconductor layout for ESD protection, in accordance with some embodiments of the present disclosure.

FIG. 2F is a schematic diagram illustrating a cross-sectional view of a portion of the semiconductor device 20F for ESD protection, in accordance with some embodiments of the present disclosure. In some embodiments, the semiconductor device 20F of FIG. 2F can correspond to a cross-section of the semiconductor layout 20C along the section line B-B' in FIG. 2D. The semiconductor device 20F of FIG. 2F can be similar to the semiconductor device 20E of FIG. 2E, except for the differences described as follows.

In some embodiments, the semiconductor device 20F can include several dielectric layers 221 to 225, several poly layers 271 to 275, several metal layers 281 to 286 and several connecting structures 290 to 299. In some embodiments, each of the dielectric layers 221 to 225 can correspond to the dielectric layer 220 of FIG. 2E. In some embodiments, each of the poly layers 271 to 275 can correspond to the poly layer 270 of FIG. 2E.

In some embodiments, the resistor 206 may include any one of the poly layers 271 to 275 associated with the corresponding one of the dielectric layers 221 to 225. In some embodiments, the resistor 206 may include any two of the poly layers 271 to 275 associated with the corresponding two of the dielectric layers 221 to 225. In some embodiments, the resistor 206 may include any three of the poly layers 271 to 275 associated with the corresponding three of the dielectric layers 221 to 225. In some embodiments, the resistor 206 may include any four of the poly layers 271 to 275 associated with the corresponding four of the dielectric layers 221 to 225. In some embodiments, the resistor 206 may include all of the poly layers 271 to 275 associated with all of the dielectric layers 221 to 225.

As shown in FIG. 2F, the metal layer 281 can be formed on the poly layer 271 through the connecting structure 291. The metal layer 282 can be formed on the poly layer 271 through the connecting structure 292. The metal layer 282 can be formed on the poly layer 272 through the connecting structure 293. The metal layer 283 can be formed on the poly layer 272 through the connecting structure 294. The metal layer 283 can be formed on the poly layer 273 through the connecting structure 295. The metal layer 284 can be formed on the poly layer 273 through the connecting structure 296. The metal layer 284 can be formed on the poly layer 274 through the connecting structure 297. The metal layer 285 can be formed on the poly layer 277 through the connecting structure 298. The metal layer 285 can be formed on the poly layer 275 through the connecting structure 299. The metal layer 286 can be formed on the poly layer 275 through the connecting structure 290.

Figure 2G:
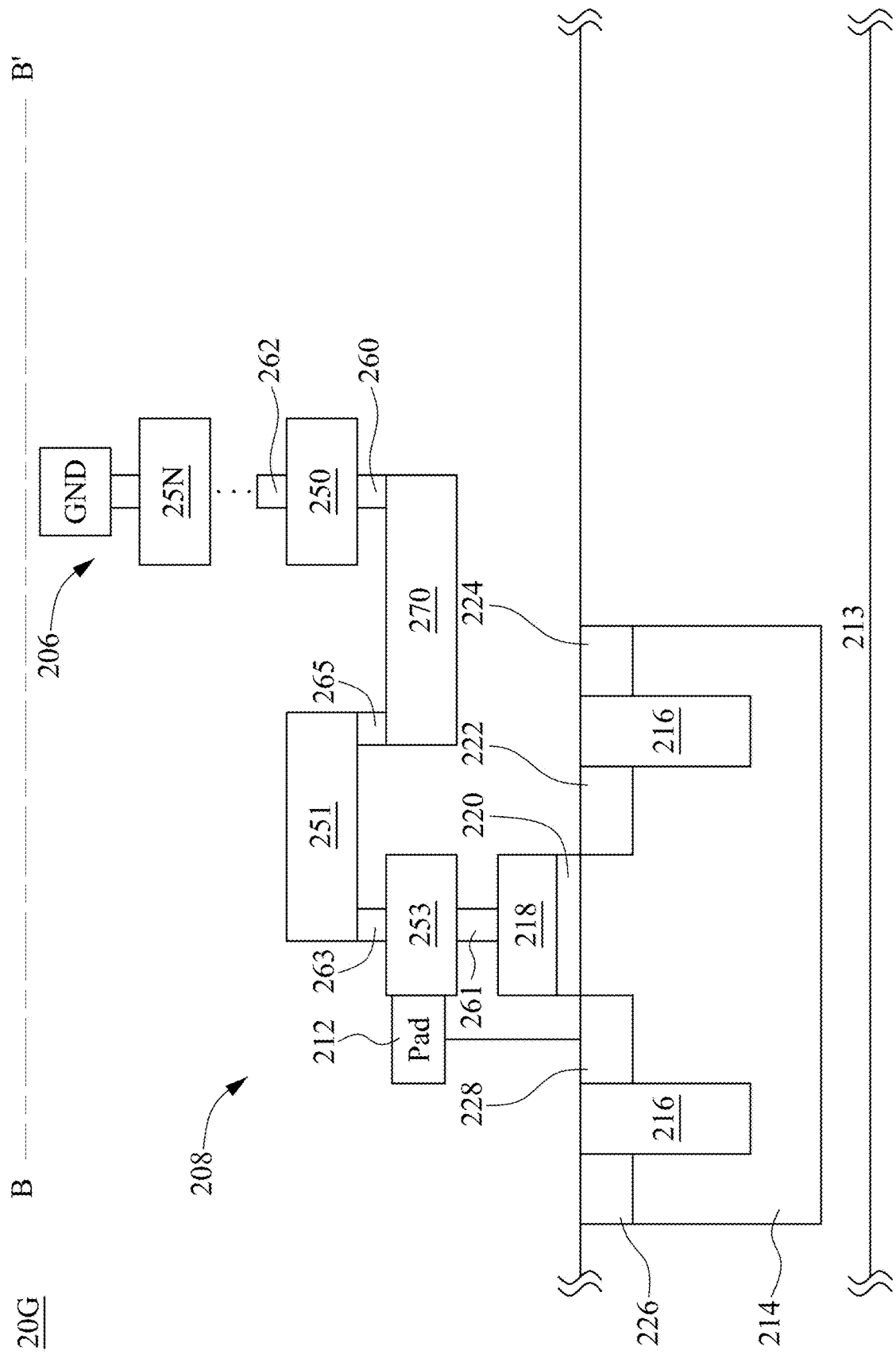
FIG. 2G is a schematic diagram illustrating another cross-sectional view of a semiconductor layout for ESD protection, in accordance with some embodiments of the present disclosure.

FIG. 2G is a schematic diagram illustrating a cross-sectional view of the semiconductor device 20G for ESD protection, in accordance with some embodiments of the present disclosure. In some embodiments, the semiconductor device 20G of FIG. 2G can correspond to a cross-section of the semiconductor layout 20C along the section line B-B' in FIG. 2D. The semiconductor device 20G of FIG. 2G can be similar to the semiconductor device 20E of FIG. 2E, except for the differences described as follows.

The semiconductor device 20G can include several metal layers 270 and 250 to 25N, and several connecting structures 260 to 265. In some embodiments, the resistor 206 may include the metal layer 270. In some embodiments, the resistor 206 may include any one of the metal layers 270 and 250 to 25N. In some embodiments, the resistor 206 may include any one of the metal layers 270 and 250 to 25N. In some embodiments, the resistor 206 may include any two of the metal layers 270 and 250 to 25N. In some embodiments, the resistor 206 may include any three of the metal layers 270 and 250 to 25N. In some embodiments, the resistor 206 may include any four of the metal layers 270 and 250 to 25N. In some embodiments, the resistor 206 may include all of the metal layers 270 and 250 to 25N.

The metal layer 253 can be formed on the gate 218 through the connecting structure 261. The metal layer 254 can be formed on the metal layer 253 through the connecting structure 263. The metal layer 251 can be formed on the metal layer 270 through the connecting structure 265. The metal layer 250 can be formed on the metal layer 270 through the connecting structure 260. The metal layer 25N can be formed on the metal layer 250 through the connecting structure 262 and other connecting structures. It should be noted that the metal layer 270 can be spaced apart from the substrate 213. The metal layer 270 is not connected to the substrate 213.

Figure 2H:
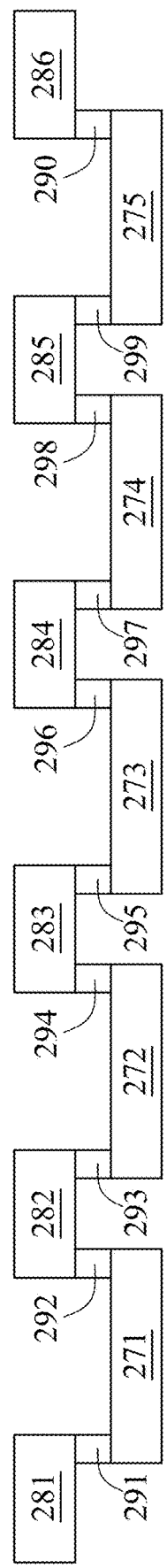
FIG. 2H is a schematic diagram illustrating another cross-sectional view of a semiconductor layout for ESD protection, in accordance with some embodiments of the present disclosure.

FIG. 2H is a schematic diagram illustrating a cross-sectional view of a portion of the semiconductor device 20H for ESD protection, in accordance with some embodiments of the present disclosure. In some embodiments, the semiconductor device 20H of FIG. 2H can correspond to a cross-section of the semiconductor layout 20C along the section line B-B' in FIG. 2D. The semiconductor device 20H of FIG. 2H can be similar to the semiconductor device 20G of FIG. 2G, except for the differences described as follows.

In some embodiments, the semiconductor device 20F can include several metal layers 271 to 275, several connecting structures 290 to 299, and several metal layers 281 to 286. In some embodiments, each of the metal layers 271 to 275 can correspond to the metal layer 270 of FIG. 2G.

In some embodiments, the resistor 206 may include any one of the metal layers 271 to 275. In some embodiments, the resistor 206 may include any two of the metal layers 271 to 275. In some embodiments, the resistor 206 may include any three of the metal layers 271 to 275. In some embodiments, the resistor 206 may include any four of the metal layers 271 to 275. In some embodiments, the resistor 206 may include all of the metal layers 271 to 275.

As shown in FIG. 2H, the metal layer 281 can be formed on the metal layer 271 through the connecting structure 291. The metal layer 282 can be formed on the metal layer 271 through the connecting structure 292. The metal layer 282 can be formed on the metal layer 272 through the connecting structure 293. The metal layer 283 can be formed on the metal layer 272 through the connecting structure 294. The metal layer 283 can be formed on the metal layer 273 through the connecting structure 295. The metal layer 284 can be formed on the metal layer 273 through the connecting structure 296. The metal layer 284 can be formed on the metal layer 274 through the connecting structure 297. The metal layer 285 can be formed on the metal layer 277 through the connecting structure 298. The metal layer 285 can be formed on the metal layer 275 through the connecting structure 299. The metal layer 286 can be formed on the metal layer 275 through the connecting structure 290.

Figure 3A:
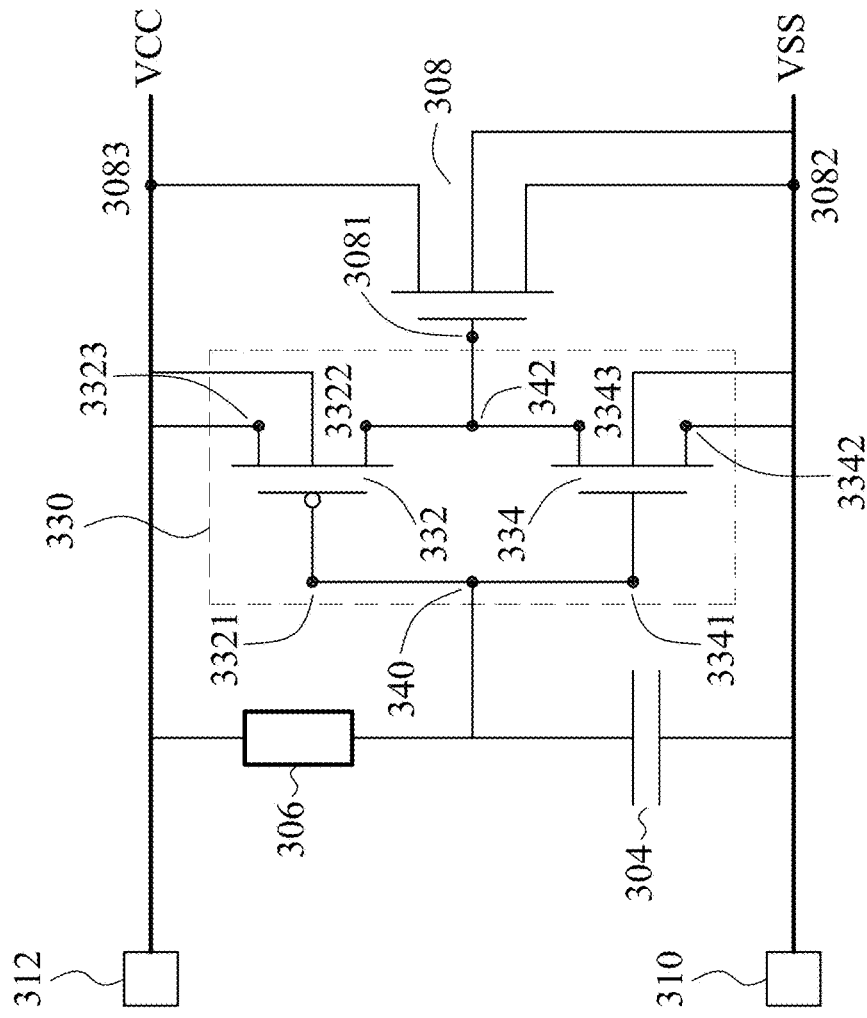
FIG. 3A is a schematic diagram of an ESD protection circuit, in accordance with some embodiments of the present disclosure.

FIG. 3A is a schematic diagram of an ESD protection circuit 30, in accordance with some embodiments of the present disclosure. The ESD protection circuit 30 of FIG. 3A is similar to the ESD protection circuit 20 of FIG. 2A, except for the differences described as follows.

As shown in FIG. 3A, an inverter 330 can be included by the ESD protection circuit 30. In some embodiments, the inverter 330 may include a NMOS transistor 334 and a PMOS transistor 332. In some embodiments, the inverter 330 can include an input node 340 and an output node 342. In some embodiments, the inverter 330 can be used to activate or turn on the ESD protection circuit 30 more earlier than the core circuit. Therefore, the protection for the core circuit during the ESD event can be improved.

In some embodiments, the capacitor 304 can be formed between the pad 310 and the input node 340 of the inverter 330. In some embodiments, the resistor 306 can be formed between the pad 312 and the input node 340 of the inverter 330.

As shown in FIG. 3A, the gate 3321 of the PMOS transistor 332 can be electrically connected to the input node 340, the gate 3341 of the NMOS transistor 334, the capacitor 304 or the resistor 306. In some embodiments, the source 3322 of the PMOS transistor 332 can be electrically connected to the output node 342 or the gate 3081 of the MOS transistor 308. In some embodiments, the drain 3323 of the PMOS transistor 332 can be electrically connected to the pad 312, the power source VCC, or the drain 3083 of the MOS transistor 308.

In some embodiments, the gate 3341 of the NMOS transistor 334 can be electrically connected to the input node 340, the capacitor 304 or the resistor 306. In some embodiments, the source 3342 of the NMOS transistor 334 can be electrically connected to the pad 310, the power source VSS or the source 3082 of the MOS transistor 308. In some embodiments, the drain 3343 of the NMOS transistor 334 can be electrically connected to the output node 342, the source 3322 of the PMOS transistor 332, or the gate 3081 of the MOS transistor 308.

Figure 3B:
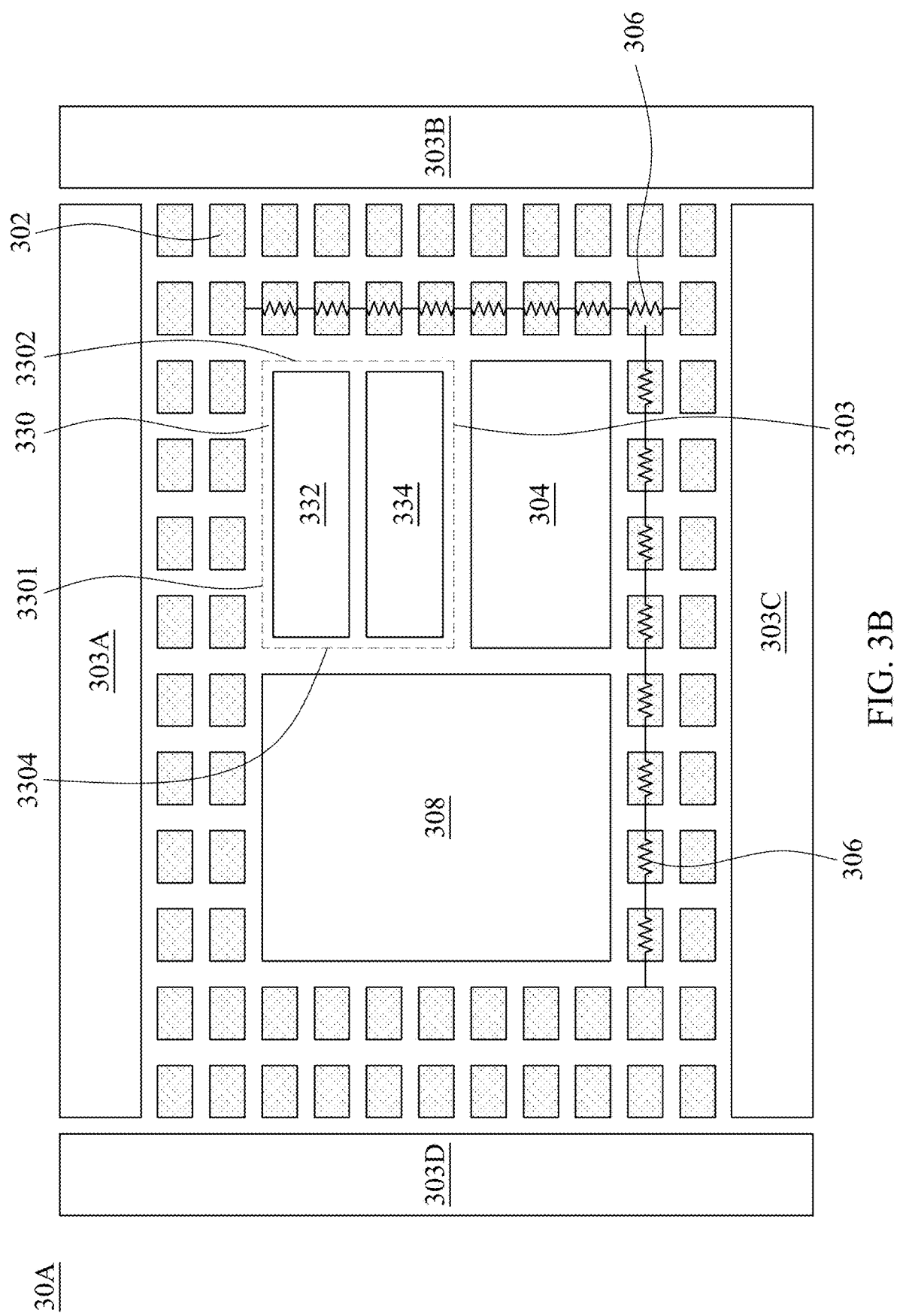
FIG. 3B is a schematic diagram of a semiconductor layout for ESD protection, in accordance with some embodiments of the present disclosure.

FIG. 3B is a schematic diagram of a semiconductor layout 30A for ESD protection, in accordance with some embodiments of the present disclosure.

As shown in FIG. 3B, in the semiconductor layout 30A, the inverter 330 can be formed adjacent to the MOS transistor 308 and the capacitor 304. In some embodiments, the inverter 330 can be disposed in a region of a substantial rectangle shape. In some embodiments, the inverter 330 can be formed between a top edge of the capacitor 304 and the right edge of the MOS transistor 308.

As shown in FIG. 3B, the inverter 330 may include four edges 3301, 3302, 3303 and 3304. The edge 3301 can be adjacent to or facing toward the core circuit 303A. The edge 3304 can be adjacent to or facing toward the MOS transistor 308 and the core circuit 303D. The edge 3303 can be adjacent to or facing toward the capacitor 304 and the core circuit 303C. The edge 3302 can be adjacent to or facing toward the core circuit 303B.

In some embodiments, the inverter 330 can include a PMOS transistor 332 and a NMOS transistor 334. The PMOS transistor 332 can be formed adjacent to an upper edge of the NMOS transistor 334. The NMOS transistor 334 may be formed adjacent to an upper edge of the capacitor 304.

In some embodiments, as shown in FIG. 3B, a portion of the resistor 306 can be formed along or adjacent to the edge 3302 of the inverter 330 and the right edge of the capacitor 304. Moreover, another portion of the resistor 306 can be formed along or adjacent to the bottom edges of the MOS transistor 308 and the capacitor 304.

In other embodiments, another portion of the resistor 306 can be formed along or adjacent to the left edges of the MOS transistor 308. Moreover, another portion of the resistor 306 can be formed along or adjacent to the top edges of the MOS transistor 308 and the inverter 330. In some embodiments, the resistor 306 can encircle or surround the inverter 330, the capacitor 304 and the MOS transistor 308.

In some embodiments, the resistor 306 may be formed along substantially 100% of the edges of the inverter 330, the capacitor 304 and the MOS transistor 308. In some embodiments, the resistor 306 may be formed along more than 90% of the edges of the inverter 330, the capacitor 304 and the MOS transistor 308. In some embodiments, the resistor 306 may be formed along more than 70% of the edges of the inverter 330, the capacitor 304 and the MOS transistor 308. In some embodiments, the resistor 306 may be formed along more than 50% of the edges of the inverter 330, the capacitor 304 and the MOS transistor 308. In some embodiments, the resistor 306 may be formed along more than 30% of the edges of the inverter 330, the capacitor 304 and the MOS transistor 308. In some embodiments, the resistor 306 may be formed along more than 10% of the edges of the inverter 330, the capacitor 304 and the MOS transistor 308.

In some embodiments, one or several portions of the dummy structure 302 can be used as or included by the resistor 306. In other words, the resistor 306 can be overlapped or incorporated into the dummy structure 302. Accordingly, it is unnecessary to occupy an area of a layout of substantial rectangle shape for the resistor 306. Therefore, the area of the semiconductor layout 30A can be reduced.

Figure 3C:
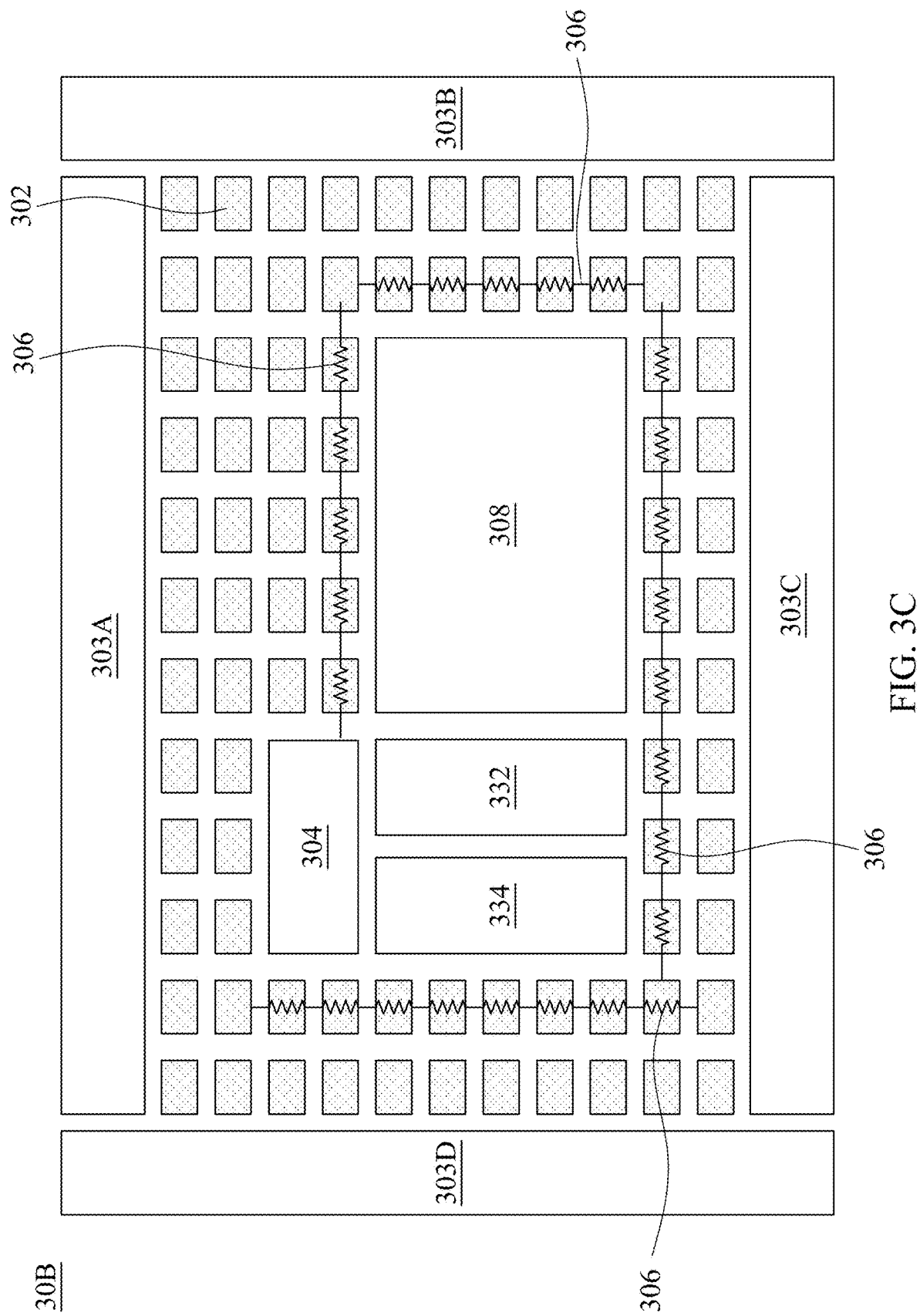
FIG. 3C is another schematic diagram of a semiconductor layout for ESD protection, in accordance with some embodiments of the present disclosure.

FIG. 3C is another schematic diagram of a semiconductor layout 30B for ESD protection, in accordance with some embodiments of the present disclosure. The semiconductor layout 30B of FIG. 3C is similar to the semiconductor layout 30A of FIG. 3B, except for the differences described as follows.

In some embodiments, the MOS transistor 308 can be disposed in a region of a substantial rectangle shape. In some embodiments, the PMOS transistor 332 can be disposed in a region of a substantial rectangle shape adjacent to a right edge of that of the MOS transistor 308. In some embodiments, the NMOS transistor 334 can be disposed in a region of a substantial rectangle shape adjacent to a right edge of that of the PMOS transistor 332. In some embodiments, the capacitor 304 can be disposed in a region of a substantial rectangle shape adjacent to top edges of the PMOS transistor 332 and the NMOS transistor 334.

As shown in FIG. 3C, in some embodiments, a portion of the resistor 306 can be formed along or adjacent to the top edge of the MOS transistor 308. In some embodiments, another portion of the resistor 306 can be formed along or adjacent to the right edge of the MOS transistor 308. In some embodiments, another portion of the resistor 306 can be formed along or adjacent to the bottom edges of the MOS transistor 308, the PMOS transistor 332 and the NMOS transistor 334. In some embodiments, another portion of the resistor 306 can be formed along or adjacent to the left edges of the capacitor 304 and the NMOS transistor 334.

In other embodiments, another portion of the resistor 306 can be formed along or adjacent to the right edge of the capacitor 304. Moreover, another portion of the resistor 306 can be formed along or adjacent to the top edge of the capacitor 304. In some embodiments, the resistor 306 can encircle or surround the PMOS transistor 332, NMOS transistor 334, the capacitor 304 and the MOS transistor 308.

In some embodiments, one or several portions of the dummy structure 302 can be used as or included by the resistor 206. In other words, the resistor 306 can be overlapped or incorporated into the dummy structure 302. Accordingly, it is unnecessary to occupy an area of a layout of substantial rectangle shape for the resistor 306. Therefore, the area of the semiconductor layout 30B can be reduced.

Figure 4:
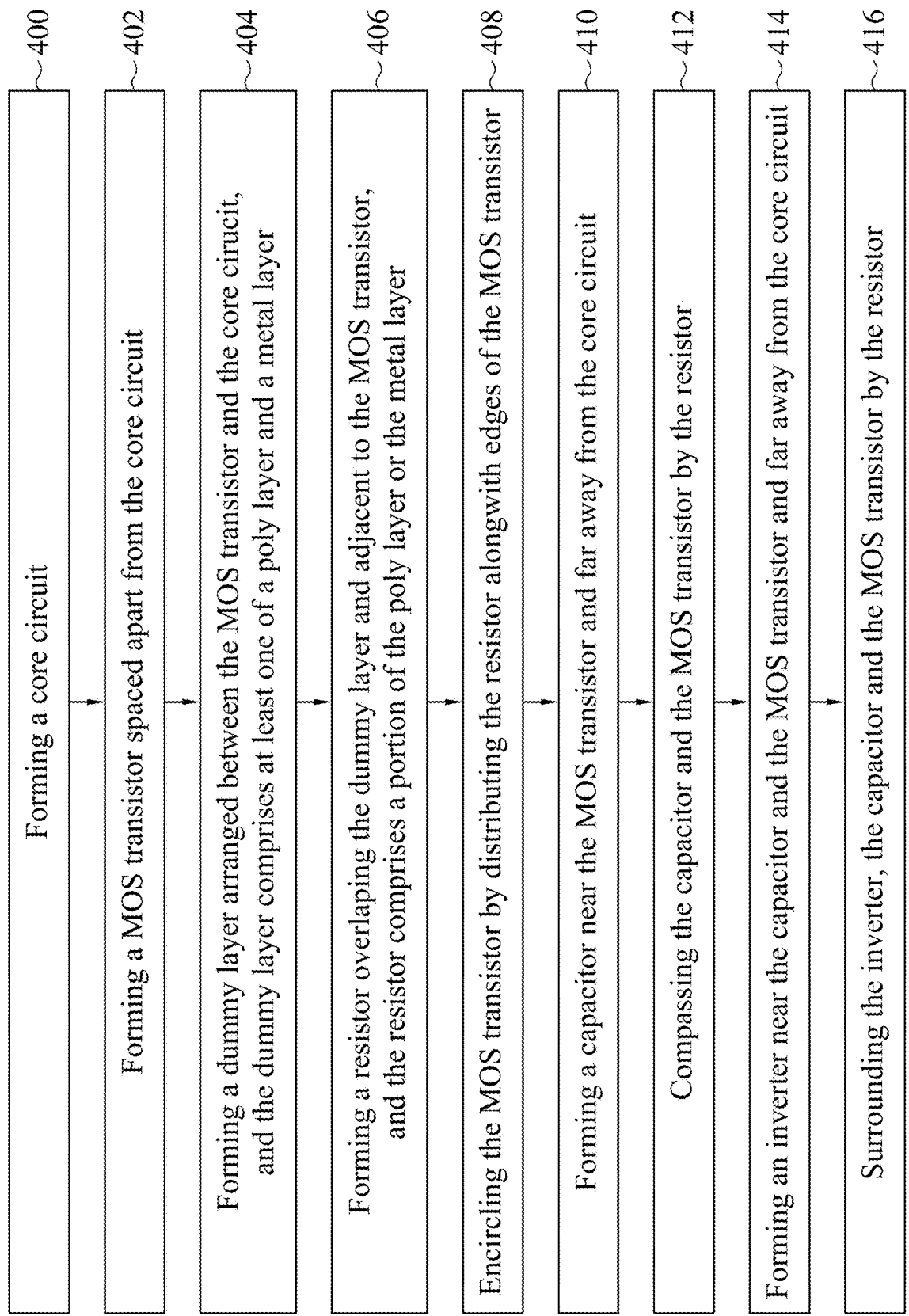
FIG. 4 illustrates a flow chart including operations for generating a semiconductor layout used for an ESD protection circuit, in accordance with some embodiments of the present disclosure.

FIG. 4 illustrates a flow chart including operations for generating a semiconductor layout used for an ESD protection circuit, in accordance with some embodiments of the present disclosure.

In operation 400, a core circuit is formed. In operation 402, a MOS transistor is formed spaced apart from the core circuit. In operation 404, a dummy layer is formed arranged between the MOS transistor and the core circuit. In some embodiments, the dummy layer can include at least one of a poly layer and a metal layer.

In operation 406, a resistor can be formed overlapping the dummy layer and adjacent to the MOS transistor. In some embodiments, the resistor can include a portion of the poly layer or the metal layer. In operation 408, the MOS transistor can be encircled by distributing the resistor along with edges of the MOS transistor.

Furthermore, in operation 410, a capacitor can be formed near the MOS transistor and far away from the core circuit. In operation 412, the capacitor and the MOS transistor can be compassed by the resistor. In operation 414, an inverter can be formed near the capacitor and the MOS transistor and far away from the core circuit. In operation 416, the inverter, the capacitor and the MOS transistor can be surrounded by the resistor.

While disclosed methods (e.g., operations 400 to 416) are illustrated and described below as a series of acts or events, it will be appreciated that the illustrated ordering of such acts or events are not to be interpreted in a limiting sense. For example, some operations may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

One aspect of the present disclosure provides a semiconductor layout used for electrostatic discharge (ESD) protection. The semiconductor layout includes a core circuit, a MOS transistor, and dummy structure and a resistor. The MOS transistor is configured to protect the core circuit by dispersing an ESD current thereacross during an ESD event. The dummy structure is arranged between the MOS transistor and the core circuit. The dummy structure comprises at least one of a poly layer and a metal layer. The resistor overlaps the dummy structure and is adjacent to the MOS transistor. The resistor includes a portion of the at least one of the poly layer and the metal layer.

Another aspect of the present disclosure provides an electrostatic discharge (ESD) protection circuit. The protection circuit includes a MOS transistor and a resistor. The MOS transistor is electrically coupled to a core circuit. The resistor is electrically coupling to a gate of the MOS transistor for creating a bias on the gate to directing an ESD current to a ground when an ESD event occurs on the core circuit. A layout of the MOS transistor is spaced apart from a layout of the core circuit by a layout of a dummy structure. The resistor is formed by utilizing a portion of the dummy structure.

Another aspect of the present disclosure provides method of generating a semiconductor layout used for an electrostatic discharge (ESD) protection circuit. The method includes forming a core circuit; forming a MOS transistor, spaced apart from the core circuit; forming a dummy structure, arranged between the MOS transistor and the core circuit, wherein the dummy structure comprises at least one of a poly layer and a metal layer; utilizing a portion of the at least one of the poly layer and the metal layer to form a resistor; overlapping the resistor with at least a portion of the dummy structure, wherein a distance between the resistor and the MOS transistor is smaller than that of between the resistor and the core circuit.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor layout used for electrostatic discharge (ESD) protection, the semiconductor layout comprising:
    a core circuit;
    a MOS transistor, configured to protect the core circuit by dispersing an ESD current thereacross during an ESD event;
    a dummy structure, arranged between the MOS transistor and the core circuit, wherein the dummy structure comprises at least one of a poly layer and a metal layer; and
    a resistor, overlapping the dummy structure and adjacent to the MOS transistor, wherein the resistor comprises a portion of the at least one of the poly layer and the metal layer.

2. The semiconductor layout of claim 1, wherein the MOS transistor is disposed in a first region of a substantial rectangle shape, and the resistor is adjacent to an edge of the MOS transistor.

3. The semiconductor layout of claim 2, wherein the MOS transistor is surrounded by the resistor.

4. The semiconductor layout of claim 2, wherein the resistor is electrically connected between a gate of the MOS transistor and a source of the MOS transistor.

5. The semiconductor layout of claim 4, further comprising:
    a capacitor, electrically connected to a power source, and arranged adjacent to the MOS transistor or the resistor.

6. The semiconductor layout of claim 5, wherein the capacitor is disposed in a second region of a substantial rectangle shape, and the resistor is adjacent to an edge of the capacitor or an edge of the MOS transistor.

7. The semiconductor layout of claim 6, wherein the capacitor is surrounded by the resistor.

8. The semiconductor layout of claim 5, wherein the capacitor is electrically connected between the gate of the MOS transistor and a drain of the MOS transistor.

9. The semiconductor layout of claim 5, further comprising:
    an inverter, arranged adjacent to the capacitor and the MOS transistor.

10. The semiconductor layout of claim 9, wherein the inverter is disposed in a third region of a substantial rectangle shape, the capacitor is adjacent to a first edge of the inverter, and the MOS transistor is adjacent to a second edge of the inverter.

11. The semiconductor layout of claim 10, wherein an input node of the inverter is electrically connected to the resistor and the capacitor, and an output node of the inverter is electrically connected to the gate of the MOS transistor.

12. The semiconductor layout of claim 11, wherein the inverter comprises:
    a NMOS transistor, wherein a gate of the NMOS transistor is connected to the input node, and a drain of the NMOS transistor is connected to the gate of the MOS transistor; and
    a PMOS transistor, wherein a gate of the PMOS transistor is connected to the input node, and a source of the PMOS transistor is connected to the gate of the MOS transistor.

13. The semiconductor layout of claim 12, wherein the NMOS transistor and the PMOS transistor are disposed in the third region, the resistor is adjacent to at least one edge of the NMOS transistor and the PMOS transistor.

14. The semiconductor layout of claim 1, wherein the metal layer is formed above the poly layer.

15. The semiconductor layout of claim 4, wherein resistance value of the metal layer is smaller than that of the poly layer.

16. The semiconductor layout of claim 1, wherein the poly layer and the metal layer are electrically isolated from the core circuit.

17. An electrostatic discharge (ESD) protection circuit, comprising:
    a MOS transistor, electrically coupled to a core circuit; and
    a resistor, electrically coupling to a gate of the MOS transistor for creating a bias on the gate to directing an ESD current to a ground when an ESD event occurs on the core circuit, wherein a layout of the MOS transistor is spaced apart from a layout of the core circuit by a layout of a dummy structure, and the resistor is formed by utilizing a portion of the dummy structure.

18. The ESD protection circuit of claim 17, wherein a distance between a layout of the resistor and the layout of the core circuit is greater than that between the layout of the resistor and the layout of the MOS transistor.

19. The ESD protection circuit of claim 17, wherein the dummy structure comprises:
    a poly layer; and
    a metal layer, formed above the poly layer.

20. A method of generating a semiconductor layout used for an electrostatic discharge (ESD) protection circuit, comprising:
    forming a core circuit;

forming a MOS transistor, spaced apart from the core circuit;
forming a dummy structure, arranged between the MOS transistor and the core circuit, wherein the dummy structure comprises at least one of a poly layer and a metal layer;
utilizing a portion of the at least one of the poly layer and the metal layer to form a resistor;
overlapping the resistor with at least a portion of the dummy structure, wherein a distance between the resistor and the MOS transistor is smaller than that of between the resistor and the core circuit.

* * * * *